United States Patent
Yamaguchi et al.

(10) Patent No.: US 10,930,847 B2
(45) Date of Patent: Feb. 23, 2021

(54) MEMORY DEVICE

(71) Applicant: Toshiba Memory Corporation, Tokyo (JP)

(72) Inventors: Marina Yamaguchi, Yokkaichi Mie (JP); Masumi Saitoh, Yokohama Kanagawa (JP); Kiwamu Sakuma, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/562,352

(22) Filed: Sep. 5, 2019

(65) Prior Publication Data
US 2020/0303643 A1 Sep. 24, 2020

(30) Foreign Application Priority Data
Mar. 20, 2019 (JP) .................................. 2019-053680

(51) Int. Cl.
*H01L 45/00* (2006.01)
*H01L 27/24* (2006.01)
*G11C 13/00* (2006.01)

(52) U.S. Cl.
CPC .......... *H01L 45/146* (2013.01); *G11C 13/004* (2013.01); *G11C 13/0026* (2013.01); *G11C 13/0028* (2013.01); *G11C 13/0069* (2013.01); *H01L 27/2436* (2013.01); *H01L 27/2481* (2013.01); *H01L 45/16* (2013.01); *G11C 2013/0045* (2013.01); *G11C 2013/0078* (2013.01)

(58) Field of Classification Search
CPC ............... H01L 45/146; H01L 45/1233; H01L 27/2481; H01L 27/249
See application file for complete search history.

(56) References Cited

U.S. PATENT DOCUMENTS 8,299,571 B2  10/2012  Ozawa et al.
9,859,337 B2  1/2018  Ratnam et al.
(Continued)

FOREIGN PATENT DOCUMENTS

| JP | 2013-197396 A | 9/2013 |
| JP | 2014-036034 A | 2/2014 |
| JP | 5558090 B2 | 7/2014 |

OTHER PUBLICATIONS

Hayakawa et al., "Highly reliable $TaO_x$ ReRAM with centralized filament for 28-nm embedded application," Symposium on VLSI Technology Digest of Technical Papers, T14-15 (2015).
(Continued)

*Primary Examiner* — Allison Bernstein
(74) *Attorney, Agent, or Firm* — Foley & Lardner LLP

(57) ABSTRACT

A memory device of an embodiment includes: a first conductive layer; a second conductive layer; a first region provided between the first conductive layer and the second conductive layer, being in contact with the first conductive layer and the second conductive layer, and including a first metal oxide, the first metal oxide corresponding to at least one selected from a group consisting of tantalum oxide, lanthanum oxide, and hafnium oxide; and a first layer provided between the first conductive layer and the second conductive layer and including a second metal oxide different from the first metal oxide.

14 Claims, 23 Drawing Sheets

(56) References Cited

U.S. PATENT DOCUMENTS

2013/0248801 A1    9/2013  Yamamoto
2015/0162383 A1    6/2015  Hwang
2018/0261651 A1*   9/2018  Hirayama ............... H01L 45/08

OTHER PUBLICATIONS

Kim et al., "ALD-based Confined PCM with a Metallic Liner toward Unlimited Endurance," IEDM16-83-IEDM16-86, 2016 IEEE.

* cited by examiner

DD' CROSS SECTION

CC' CROSS SECTION

R_cell_off > R_parallel > R_cell_on

GG' CROSS SECTION

FF' CROSS SECTION

US 10,930,847 B2

MEMORY DEVICE

CROSS-REFERENCE TO RELATED APPLICATION

This application is based upon and claims the benefit of priority from Japanese Patent Application No. 2019-053680, filed on Mar. 20, 2019, the entire contents of which are incorporated herein by reference.

FIELD

Embodiments described herein relate generally to memory devices.

BACKGROUND

In a two-terminal resistive random access memory (ReRAM), current is flowed by applying a predetermined voltage to a memory cell including a resistive change element, and the resistive change element is changed from a high resistance state to a low resistance state or from the low resistance state to the high resistance state. Changing the resistive change element from the high resistance state to the low resistance state is referred to as a set operation. Changing the resistive change element from the low resistance state to the high resistance state is referred to as a reset operation. For example, when the high resistance state is defined as data "1" and the low resistance state is defined as data "0", the memory cell can store one-bit data of "1" and "0".

The data stored in the memory cell is determined by applying a predetermined read voltage in the memory cell and detecting the current flowing in the memory cell. In order to guarantee the reliability of the resistive random access memory, suppression of variation of the current flowing in the memory cell is required.

DETAILED DESCRIPTION

Figure 1:
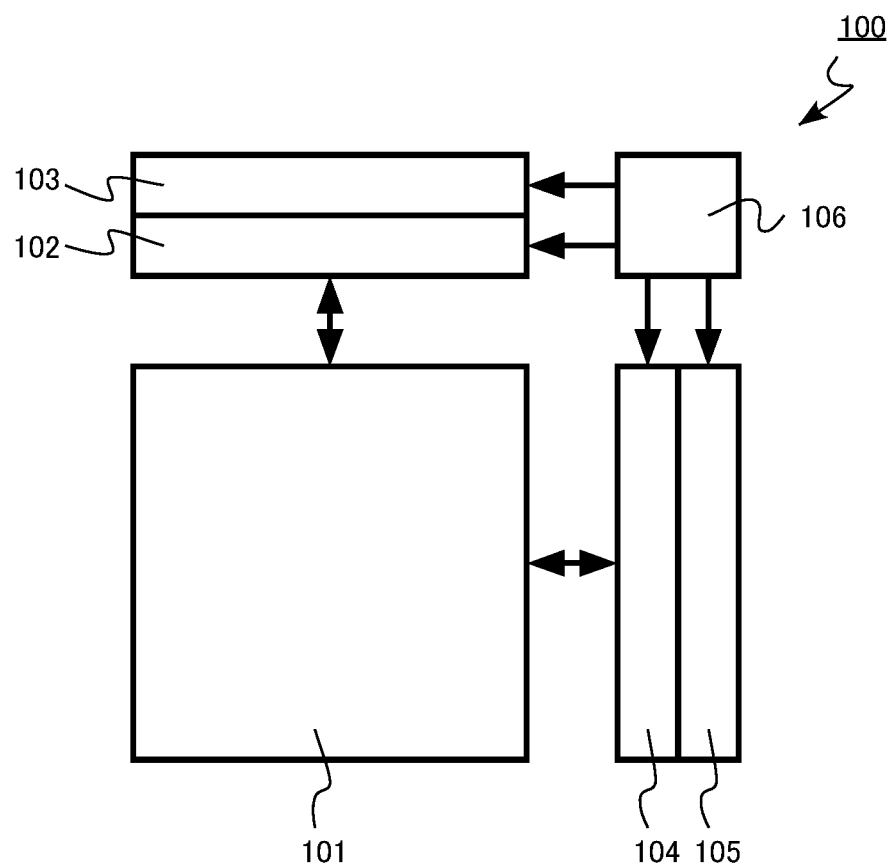
FIG. 1 is a block diagram of a memory device of a first embodiment.

A memory device of an embodiment includes: a first conductive layer; a second conductive layer; a first region provided between the first conductive layer and the second conductive layer, the first region being in contact with the first conductive layer and the second conductive layer, the first region including a first metal oxide, and the first metal oxide being at least one metal oxide selected from a group consisting of tantalum oxide, lanthanum oxide, and hafnium oxide; and a first layer provided between the first conductive layer and the second conductive layer, the first layer including a second metal oxide different from the first metal oxide.

Embodiments of the present disclosure will be described below with reference to the drawings. It should be noted that, in the following description, the same or similar members will be denoted by the same signs, and the description of, for example, once-described members may be omitted as appropriate.

In the specification, terms "upper", "lower", "upper portion", and "lower portion" may be used for convenience. The terms "upper", "lower", "upper portion", and "lower portion" just indicate a relative positional relation in the drawings, and does not define a positional relation with respect to gravity.

Qualitative analysis and quantitative analysis of the chemical composition of members constituting a memory device in the specification can be performed by, for example, secondary ion mass spectroscopy (SIMS) and energy dispersive X-ray spectroscopy (EDX). In addition, for example, a transmission electron microscope (TEM) can be used to measure, for example, the thicknesses of the members constituting the memory device and the distance between the members.

Memory devices of the embodiments will now be described with reference to the drawings.

First Embodiment

A memory device of a first embodiment includes: a first conductive layer; a second conductive layer; a first region provided between the first conductive layer and the second conductive layer, the first region being in contact with the first conductive layer and the second conductive layer, the first region including a first metal oxide, and the first metal oxide being at least one metal oxide selected from a group consisting of tantalum oxide, lanthanum oxide, and hafnium oxide; and a first layer provided between the first conductive layer and the second conductive layer, the first layer including a second metal oxide different from the first metal oxide.

The memory device of the first embodiment also includes: a first conductive layer extending in a first direction; a second conductive layer extending in a second direction intersecting the first direction; a first region provided between the first conductive layer and the second conductive layer, being in contact with the first conductive layer and the second conductive layer, and including a first metal oxide; and a resistive change element provided between the first conductive layer and the second conductive layer.

Figure 2:
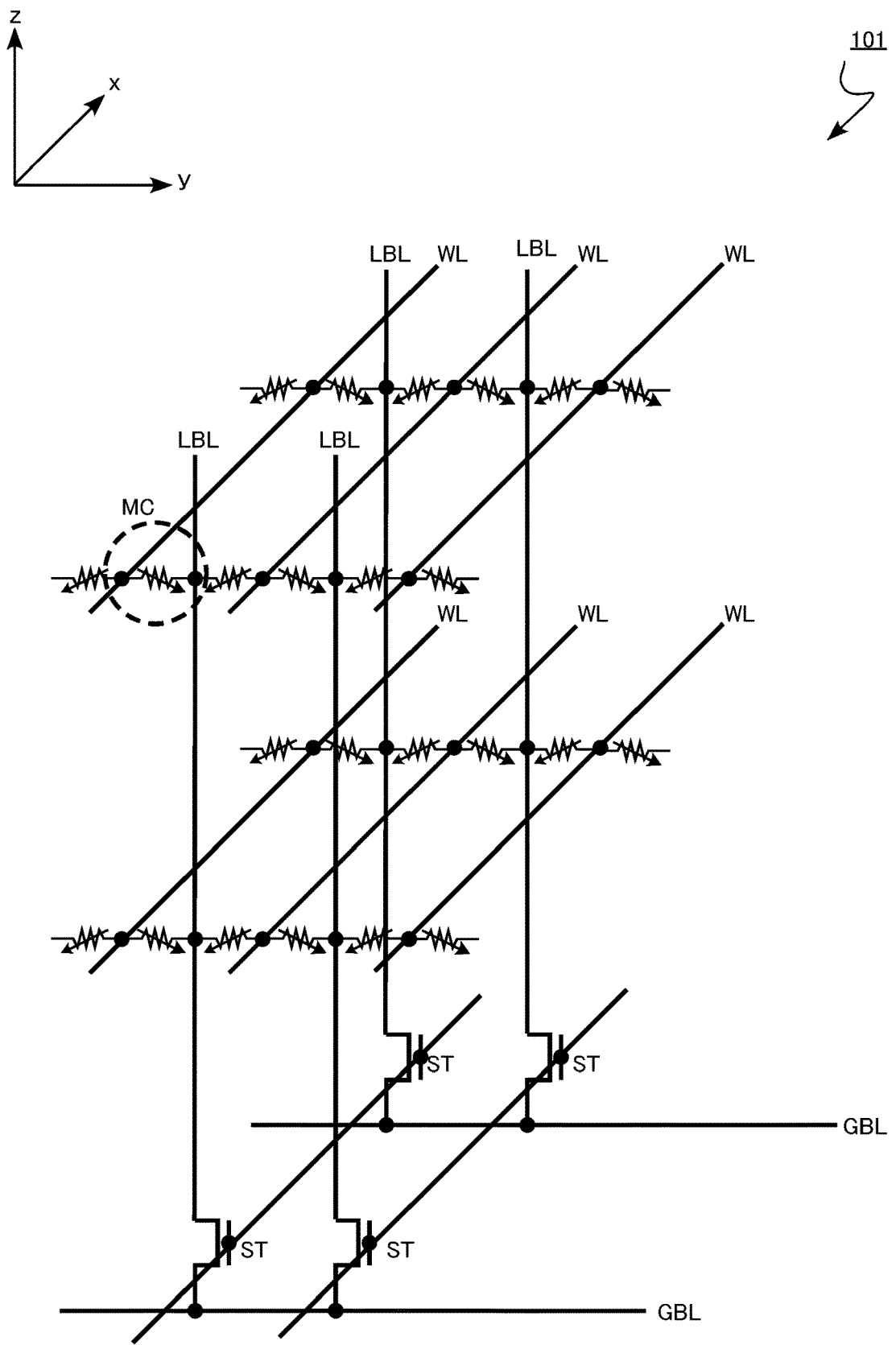
FIG. 2 is an equivalent circuit diagram of a memory cell array of the first embodiment.

FIG. 1 is a block diagram of a memory device of a first embodiment. FIG. 2 is an equivalent circuit diagram of a memory cell array of the first embodiment. FIG. 2 schematically illustrates wiring structure in the memory cell array. The memory cell array of a resistive random access memory 100 of the first embodiment has three-dimensional structure in which memory cells MC are sterically disposed.

The resistive random access memory 100 is a two-terminal resistive random access memory. The resistive random access memory 100 is of a filament type, and changes the resistance of a resistive change element by, for example, generating a filament having oxygen deficiency in the resistive change element by applying voltage.

As illustrated in FIG. 1, the resistive random access memory 100 includes a memory cell array 101, a word line driver circuit 102, a row decoder circuit 103, a sense amplifier circuit 104, a column decoder circuit 105, and a control circuit 106.

In addition, as illustrated in FIG. 2, a plurality of memory cells MC is sterically disposed in the memory cell array 101. A region surrounded by a dashed line in FIG. 2 corresponds to one memory cell MC.

The memory cell array 101 is formed, for example, on a semiconductor substrate (not illustrated). The memory cell array 101 includes a plurality of word lines WL (first conductive layers) and a plurality of local bit lines LBL (second conductive layers).

The word line WL extends in an x direction (first direction). The local bit line LBL extends in a z direction (second direction) intersecting the x direction. The word line WL and the local bit line LBL intersect, for example, vertically. The memory cell MC is disposed at the intersection of the word line WL and the local bit line LBL.

The plurality of word lines WL is electrically connected to the word line driver circuit 102. The plurality of local bit lines LBL is connected to the sense amplifier circuit 104. A selection transistor ST and a global bit line GBL are provided between the plurality of local bit lines LBL and the sense amplifier circuit 104.

The row decoder circuit 103 has a function of selecting the word line WL in accordance with an input row address signal. The word line driver circuit 102 has a function of applying a predetermined voltage to the word line WL selected by the row decoder circuit 103.

The column decoder circuit 105 has a function of selecting the local bit line LBL in accordance with an input column address signal. The sense amplifier circuit 104 has a function of applying a predetermined voltage to the local bit line LBL selected by the column decoder circuit 105. The sense amplifier circuit 104 also has a function of detecting and amplifying the current flowing between the selected word line WL and the selected local bit line LBL.

The control circuit 106 has a function of controlling the word line driver circuit 102, the row decoder circuit 103, the sense amplifier circuit 104, the column decoder circuit 105, and other circuits (not illustrated).

For example, a transistor including a semiconductor substrate (not illustrated) and a wiring layer constitute circuits such as the word line driver circuit 102, the row decoder circuit 103, the sense amplifier circuit 104, the column decoder circuit 105, and the control circuit 106.

Figure 3A:
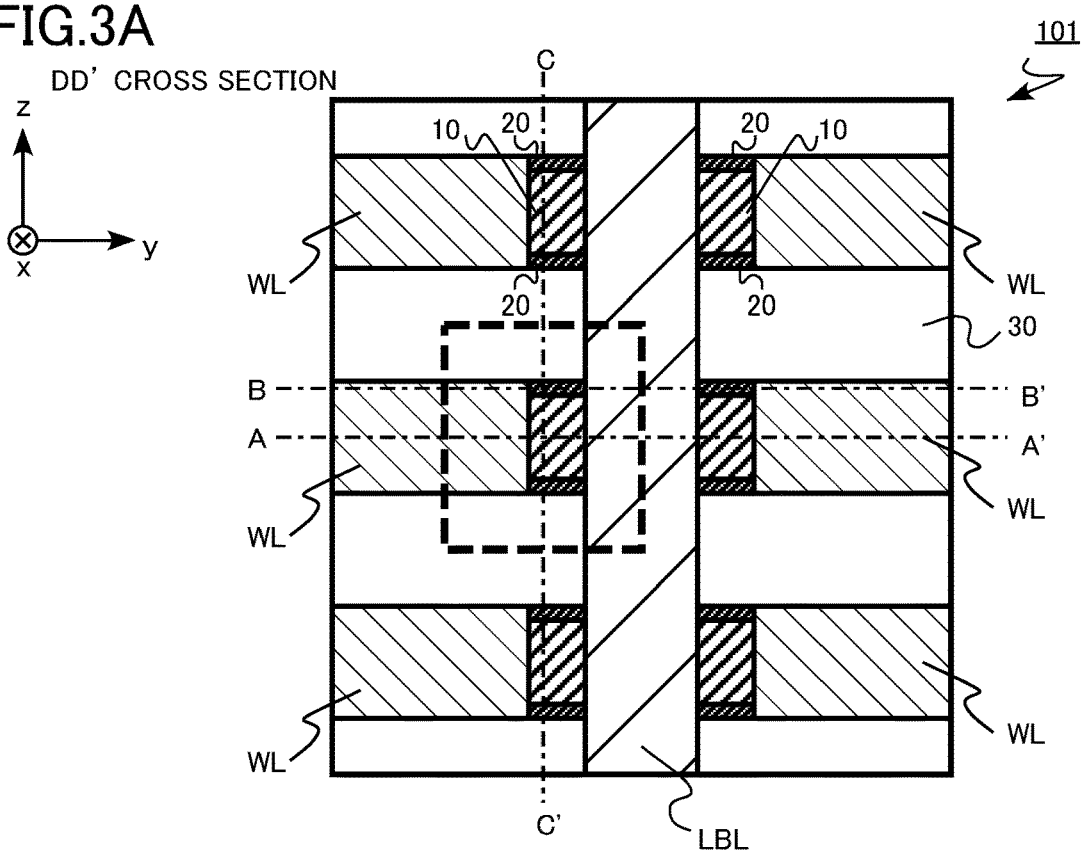
FIGS. 3A and 3B are schematic cross-sectional views of the memory cell array of the memory device of the first embodiment.
Figure 3B:
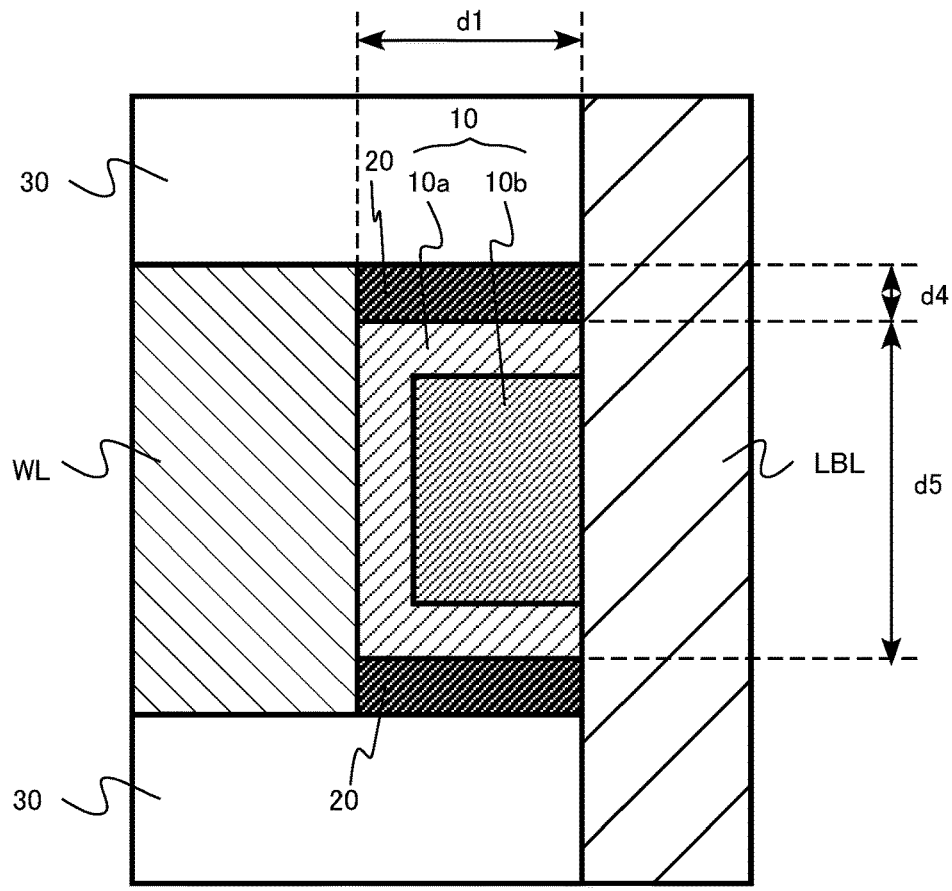

FIGS. 3A and 3B are schematic cross-sectional views of a memory cell array of the memory device of the first embodiment. FIG. 3A is a yz cross-sectional view of the memory cell array 101. FIG. 3A illustrates a DD' cross section of FIG. 4A. FIG. 3B is an enlarged view of a part of FIG. 3A. A region surrounded by a dashed line in FIG. 3A corresponds to one memory cell MC.

Figure 4A:
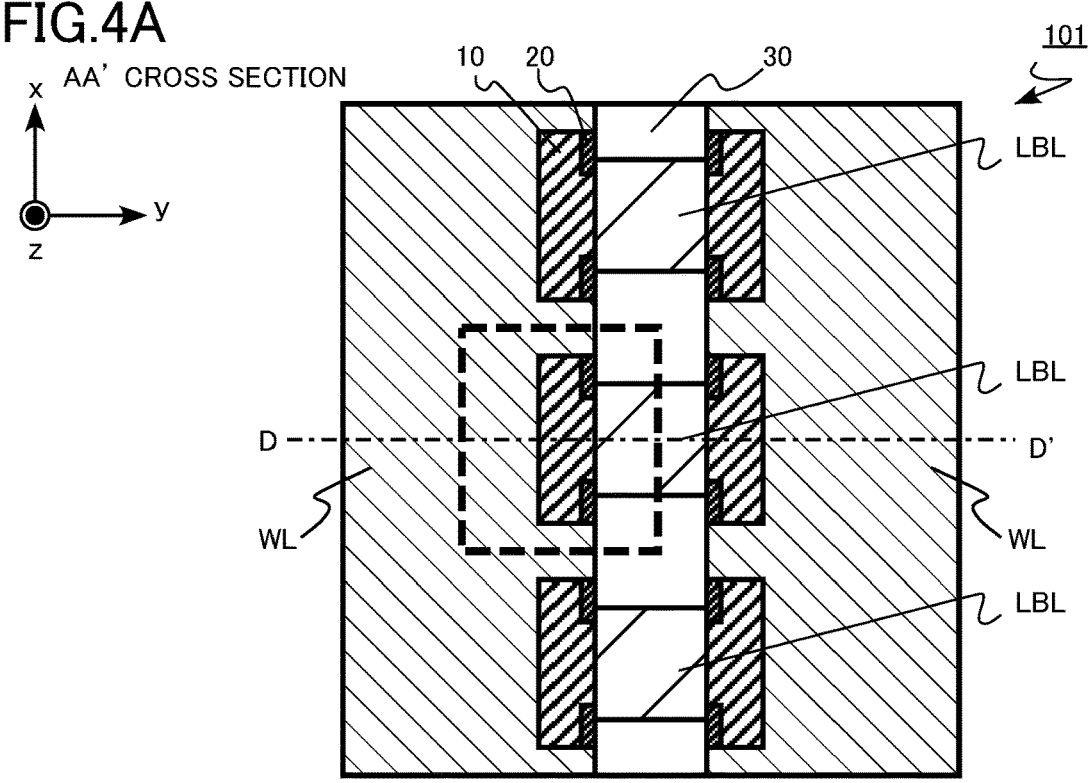
FIGS. 4A and 4B are schematic cross-sectional views of the memory cell array of the memory device of the first embodiment.
Figure 4B:
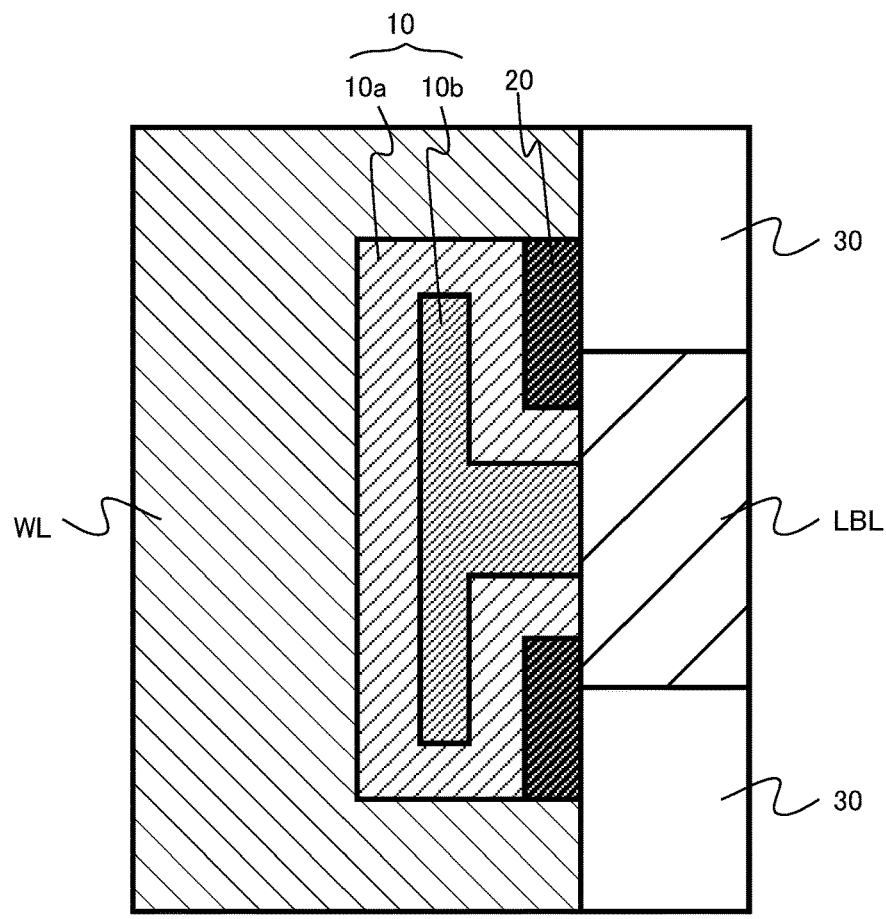

FIGS. 4A and 4B are schematic cross-sectional views of the memory cell array of the memory device of the first embodiment. FIG. 4A is an xy cross-sectional view of the memory cell array 101. FIG. 4A illustrates an AA' cross section of FIG. 3A. FIG. 4B is an enlarged view of a part of FIG. 4A. A region surrounded by a dashed line in FIG. 4A corresponds to one memory cell MC.

Figure 5A:
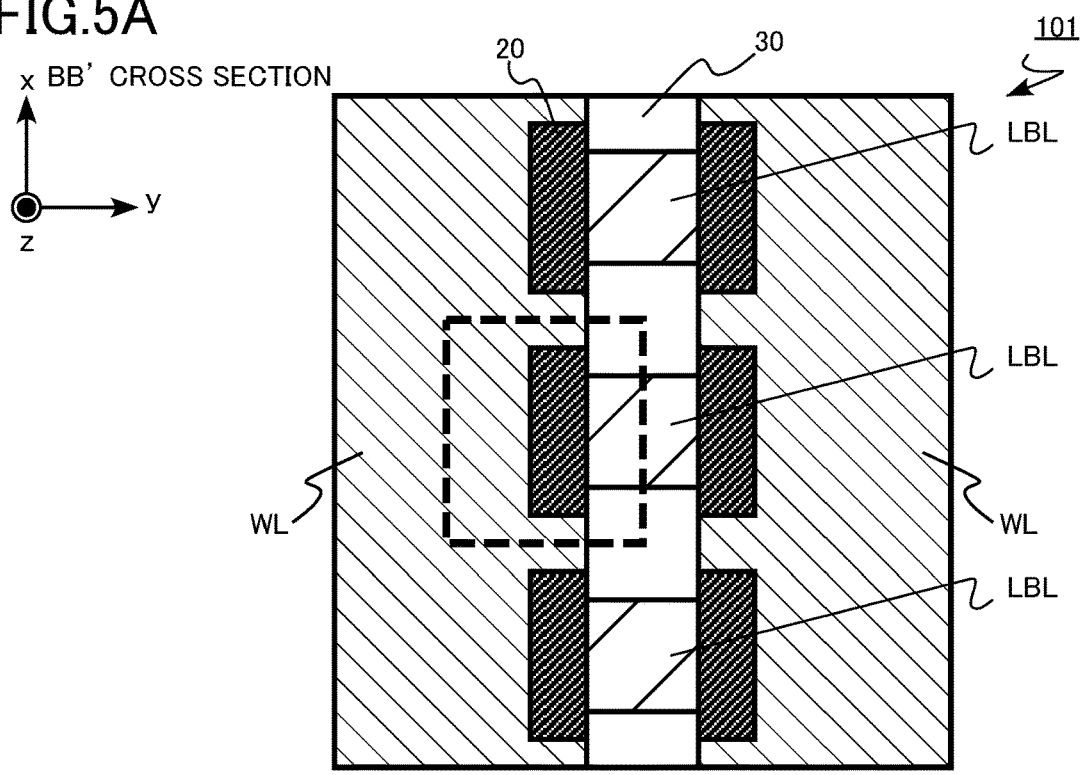
FIGS. 5A and 5B are schematic cross-sectional views of the memory cell array of the memory device of the first embodiment.
Figure 5B:
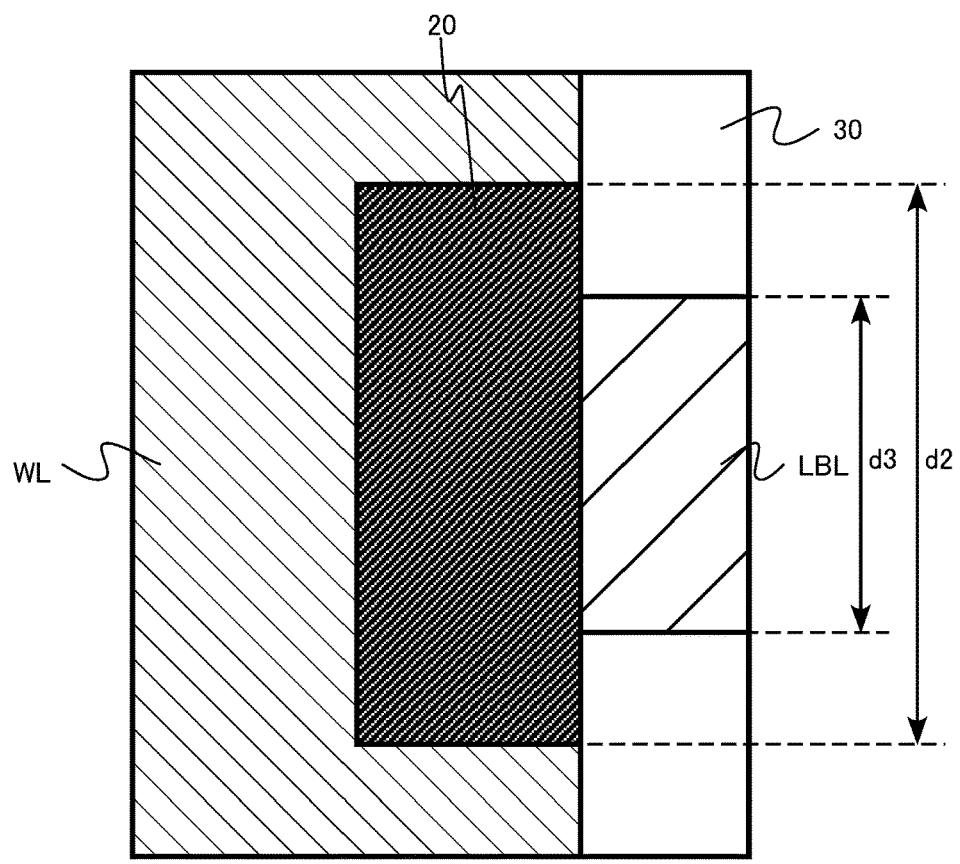

FIGS. 5A and 5B are schematic cross-sectional views of the memory cell array of the memory device of the first embodiment. FIG. 5A is an xy cross-sectional view of the memory cell array 101. FIG. 5A illustrates a BB' cross section of FIG. 3A. FIG. 5B is an enlarged view of a part of FIG. 5A. A region surrounded by a dashed line in FIG. 5A corresponds to one memory cell MC.

Figure 6A:
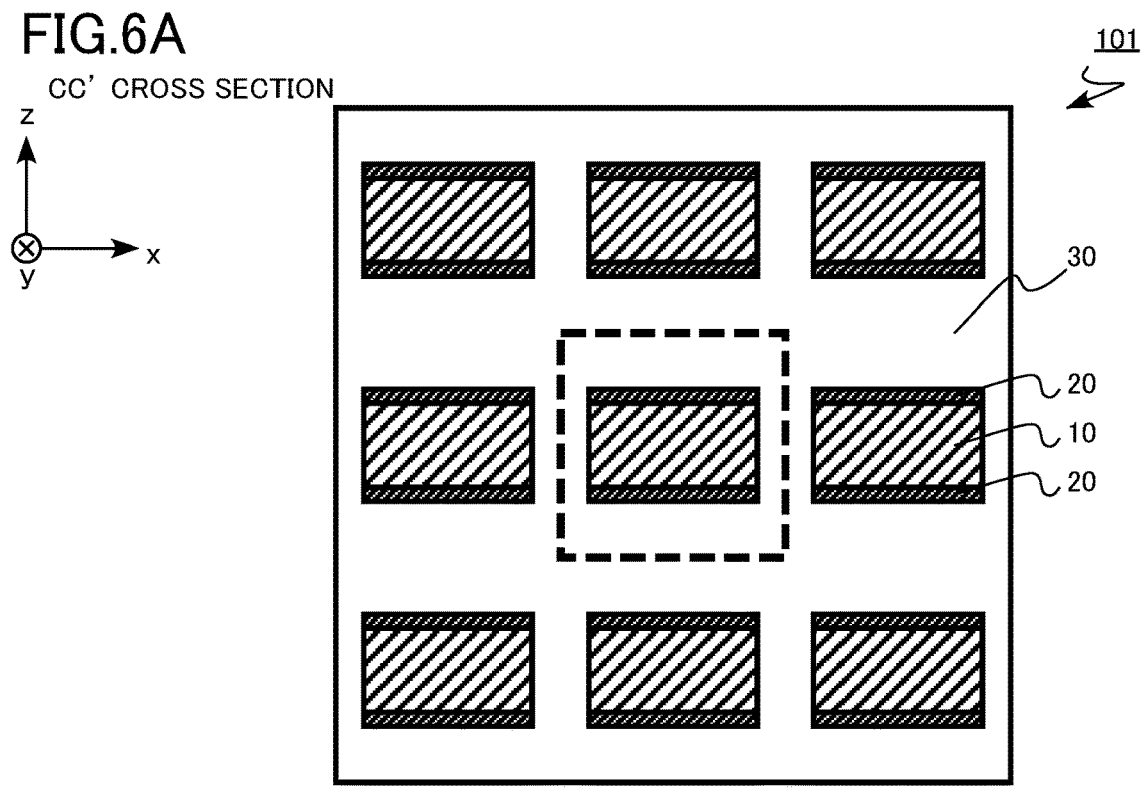
FIGS. 6A and 6B are schematic cross-sectional views of the memory cell array of the memory device of the first embodiment.
Figure 6B:
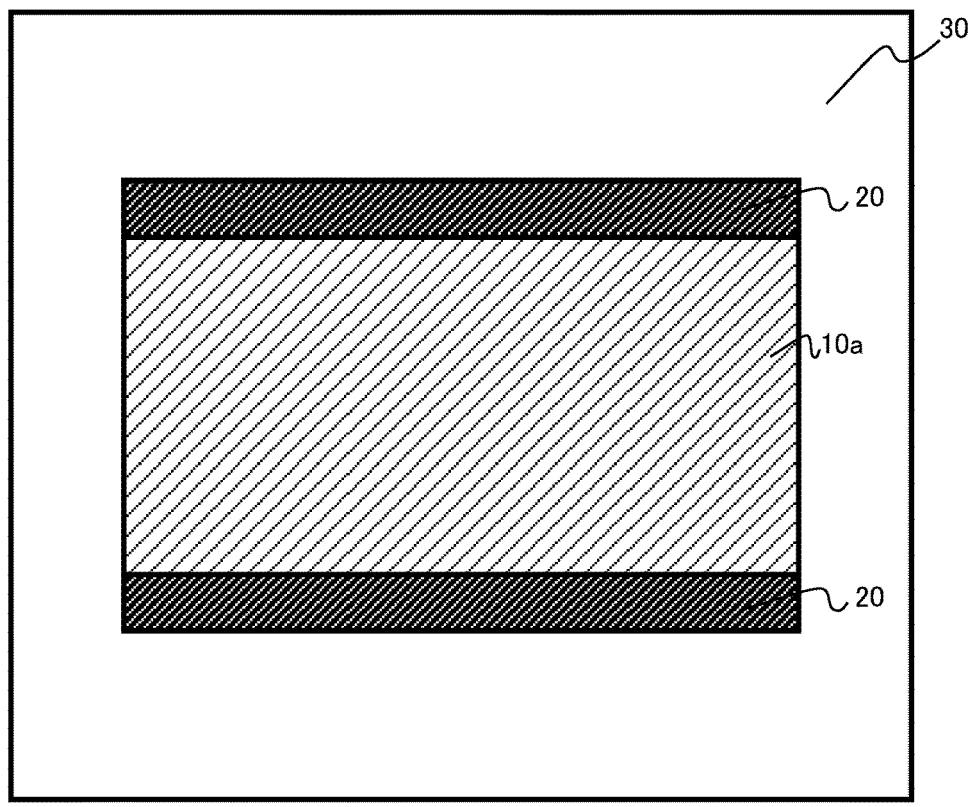

FIGS. 6A and 6B are schematic cross-sectional views of the memory cell array of the memory device of the first embodiment. FIG. 6A is an xz cross-sectional view of the memory cell array 101. FIG. 6A illustrates a CC' cross section of FIG. 3A. FIG. 6B is an enlarged view of a part of FIG. 6A. A region surrounded by a dashed line in FIG. 6A corresponds to one memory cell MC.

The memory cell array 101 includes the word line WL (first conductive layer), the local bit line LBL (second conductive layer), a resistive change layer 10 (resistive change element), a parallel resistance region 20 (first region), and an interlayer insulating layer 30. The resistive change layer 10 includes a first metal oxide layer 10a (first layer) and a second metal oxide layer 10b (second layer).

The word line WL extends in the x direction (first direction). The word lines WL are stacked in the z direction with the interlayer insulating layer 30 interposed between the word lines WL.

The word line WL is made of, for example, metal. The word line WL is made of, for example, titanium nitride (TiN) or tungsten (W).

The local bit line LBL extends in the z direction (second direction). The local bit lines LBL are disposed in the x direction with the interlayer insulating layer 30 interposed between the local bit lines LBL. The local bit lines LBL are also disposed in a y direction with the interlayer insulating layer 30 interposed between the local bit lines LBL.

The local bit line LBL is made of, for example, metal. The local bit line LBL is made of, for example, titanium nitride (TiN) or tungsten (W).

The resistive change layer 10 is provided between the word line WL and the local bit line LBL. The resistive change layer 10 has a function of changing from a high resistance state to a low resistance state or from the low resistance state to the high resistance state by a predetermined voltage application between the word line WL and the local bit line LBL. The resistive change layer 10 has a function of storing data.

The resistive change layer 10 includes the first metal oxide layer 10a (first layer) and the second metal oxide layer 10b (second layer). The resistive change layer 10 has a width (d1 in FIG. 3B) of, for example, equal to or more than 3 nm and equal to or less than 10 nm in the y direction (third direction) perpendicular to the x direction (first direction) and the z direction (second direction).

The first metal oxide layer 10a contains a second metal oxide. The first metal oxide layer 10a contains the second metal oxide as a main component. Containing the second metal oxide as a main component means that the second metal oxide has the highest molar ratio among substances constituting the first metal oxide layer 10a. The second metal oxide has a molar ratio of, for example, equal to or more than 80%.

The second metal oxide is to at least one metal oxide selected from the group consisting of, for example, titanium oxide, aluminum oxide, tantalum oxide, and hafnium oxide. The second metal oxide is, for example, aluminum oxide.

The second metal oxide layer 10b is provided at one of a position between the word line WL and the first metal oxide layer 10a and a position between the local bit line LBL and the first metal oxide layer 10a. FIGS. 3A and 3B illustrate the second metal oxide layer 10b provided between the local bit line LBL and the first metal oxide layer 10a. The second metal oxide layer 10b is in contact with, for example, the first metal oxide layer 10a.

The second metal oxide layer 10b includes a third metal oxide different from the second metal oxide. The second metal oxide layer 10b contains the third metal oxide as a main component. Containing the third metal oxide as a main component means that the third metal oxide has the highest molar ratio among substances constituting the second metal oxide layer 10b. The third metal oxide has a molar ratio of, for example, equal to or more than 80%.

The third metal oxide is at least one metal oxide selected from the group consisting of, for example, titanium oxide, aluminum oxide, and hafnium oxide. When the second metal oxide is aluminum oxide, the third metal oxide is, for example, titanium oxide.

The parallel resistance region 20 is provided between the word line WL and the local bit line LBL. The parallel resistance region 20 is in contact with the word line WL and the local bit line LBL. In particular, the parallel resistance region 20 has a function of flowing current when the resistive change layer 10 is in a high resistance state.

The parallel resistance region 20 contains a first metal oxide. The parallel resistance region 20 contains the first metal oxide as a main component. Containing the first metal oxide as a main component means that the first metal oxide has the highest molar ratio among substances constituting the parallel resistance region 20. The first metal oxide has a molar ratio of, for example, equal to or more than 80%.

The first metal oxide is at least one metal oxide selected from the group consisting of, for example, tantalum oxide, lanthanum oxide, and hafnium oxide.

The first metal oxide has a band gap of, for example, equal to or more than 4 eV and equal to or less than 7 eV. In addition, the first metal oxide has a band gap, for example, smaller than that of the second metal oxide. In addition, the first metal oxide has a band gap, for example, smaller than that of the third metal oxide.

The first metal oxide has a dielectric constant of, for example, equal to or more than 20 and equal to or less than 30. In addition, the first metal oxide has a dielectric constant, for example, greater than that of the second metal oxide. In addition, the first metal oxide has a dielectric constant, for example, greater than that of the third metal oxide.

Changing the resistive change layer 10 from the high resistance state to the low resistance state is referred to as a set operation. Changing the resistive change layer 10 from the low resistance state to the high resistance state is referred to as a reset operation. For example, when the high resistance state is defined as data "1" and the low resistance state is defined as data "0", the memory cell can store one-bit data of "1" and "0".

The voltage to be applied to the memory cell MC in the set operation is referred to as a set voltage (Vset). The voltage to be applied to the memory cell MC in the reset operation is referred to as a reset voltage (Vreset). The set voltage (Vset) is also referred to as a write voltage.

The data stored in the memory cell MC is determined by applying a predetermined read voltage (Vread) between the word line WL and the local bit line LBL and detecting the current flowing in the memory cell MC.

When a predetermined read voltage (Vread) is applied between the word line WL and the local bit line LBL, the parallel resistance region 20 has a resistance lower than that of the resistive change layer 10 in the high resistance state and a resistance higher than that of the resistive change layer 10 in the low resistance state.

In addition, for example, when a voltage (Vset/2) of half a predetermined write voltage (set voltage (Vset)) is applied between the word line WL and the local bit line LBL, the parallel resistance region 20 has a resistance higher than that of the resistive change layer 10 in the high resistance state. In addition, for example, when a voltage (Vread/2) of half a predetermined read voltage (Vread) is applied between the word line WL and the local bit line LBL, the parallel resistance region 20 has a resistance higher than that of the resistive change layer 10 in the high resistance state. In addition, for example, when a voltage (Vreset/2) of half a predetermined reset voltage (Vreset) is applied between the word line WL and the local bit line LBL, the parallel resistance region 20 has a resistance higher than that of the resistive change layer 10 in the high resistance state.

The interlayer insulating layer 30 has a function of electrically insulating components of the memory cell array 101. The interlayer insulating layer 30 is made of, for example, oxide or oxynitride. The interlayer insulating layer 30 is made of, for example, silicon oxide.

As illustrated in FIGS. 3A and 3B, the parallel resistance regions 20 are provided above and below the resistive change layer 10 in the yz cross section of the memory cell array 101. The resistive change layer 10 is sandwiched between a part of the parallel resistance region 20 and another part of the parallel resistance region 20.

In addition, as illustrated in FIGS. 3A and 3B, the parallel resistance region 20 is sandwiched between the resistive change layer 10 and the interlayer insulating layer 30.

In addition, as illustrated in FIG. 5B, the parallel resistance region 20 has a width (d2 in FIG. 5B) in the x direction greater than a width (d3 in FIG. 5B) of the local bit line LBL in the x direction.

The parallel resistance region 20 has a cross-sectional area in a plane perpendicular to the direction from the word line WL to the local bit line LBL, that is, the plane (xz plane) perpendicular to the y direction, the cross-sectional area being, for example, equal to or more than 0.33 times and equal to or less than one time of that of the first metal oxide layer 10a in the plane perpendicular to the y direction. The parallel resistance region 20 has a cross-sectional area in the plane (xz plane) perpendicular to the y direction, the cross-sectional area being, for example, equal to or more than 0.33 times and equal to or less than one time of that of the resistive change layer 10 in the plane perpendicular to the y direction.

For example, the parallel resistance region 20 has a cross-sectional area in a CC' cross section illustrated in FIG. 6B, the cross-sectional area being, for example, equal to or more than 0.33 times and equal to or less than one time of that of the first metal oxide layer 10a. In addition, the parallel resistance region 20 has a cross-sectional area of, for example, equal to or more than 0.33 times and equal to or less than one time of that of the resistive change layer 10.

When the cross-sectional areas of the parallel resistance region 20, the first metal oxide layer 10a, or the resistive change layer 10 change depending on positions in the y direction, for example, the cross-sectional areas at positions where the cross-sectional area of the first metal oxide layer 10a or that of the resistive change layer 10 is maximized are adopted as representative values.

In addition, as illustrated in FIG. 3B, the parallel resistance region 20 has a width (d4 in FIG. 3B) in the z direction, for example, smaller than a width (d5 in FIG. 3B) of the first metal oxide layer 10a in the z direction. The parallel resistance region 20 has the width d4 in the z direction, the width d4 being for example, equal to or more than 0.15 times and equal to or less than 0.5 times of the width d5 of the first metal oxide layer 10a in the z direction.

In addition, as illustrated in FIG. 3B, the parallel resistance region 20 has a width (d4 in FIG. 3B) in the z direction, for example, smaller than a width (d5 in FIG. 3B) of the resistive change layer 10 in the z direction. The parallel resistance region 20 has the width d4 in the z direction, the width d4 being, for example, equal to or more than 0.15 times and equal to or less than 0.5 times of the width d5 of the resistive change layer 10 in the z direction.

A method of manufacturing the resistive random access memory 100 of the first embodiment will now be described. FIGS. 7A, 7B, 8A, 8B, 9A, 9B, 10A, 10B, 11A, 11B, 12A, 12B, 13A, 13B, 14A, 14B, 15A, 15B, 16A, 16B, 17A, and 17B are schematic cross-sectional views illustrating a method of manufacturing the memory device of the first embodiment. Each of FIGS. 7A, 8A, 9A, 10A, 11A, 12A, 13A, 14A, 15A, 16A, and 17A illustrates cross sections in accordance with FIG. 3A. Each of FIGS. 7B, 8B, 9B, 10B, 11B, 12B, 13B, 14B, 15B, 16B, and 17B illustrates cross sections in accordance with FIG. 3B. FIGS. 7A, 7B, 8A, 8B, 9A, 9B, 10A, 10B, 11A, 11B, 12A, 12B, 13A, 13B, 14A, 14B, 15A, 15B, 16A, 16B, 17A, and 17B illustrate one example of a method of manufacturing the memory cell array 101 of the resistive random access memory 100.

Figure 7A:
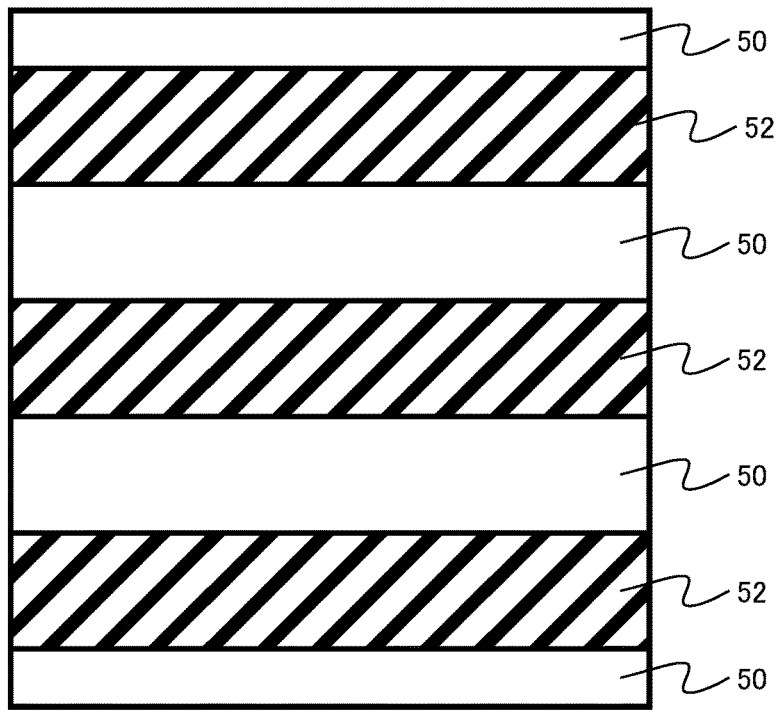
FIGS. 7A and 7B are schematic cross-sectional views illustrating a method of manufacturing the memory device of the first embodiment.
Figure 7B:
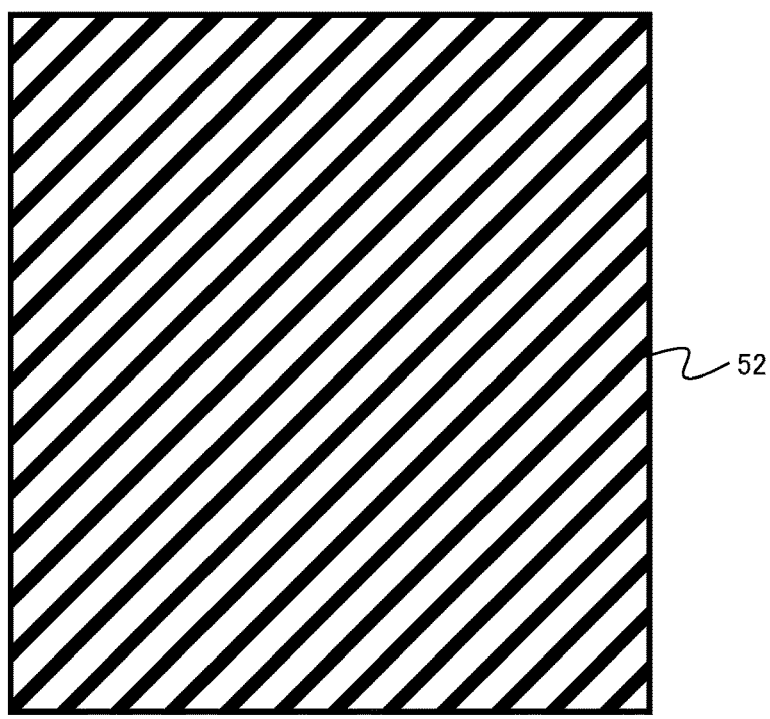

First, silicon oxide layers 50 and silicon nitride layers 52 are alternately stacked on a semiconductor substrate (not illustrated) (FIGS. 7A and 7B). The silicon oxide layer 50 and the silicon nitride layer 52 are formed by, for example, a chemical vapor deposition (CVD) method. A part of the silicon oxide layer 50 finally turns to the interlayer insulating layer 30.

Figure 8A:
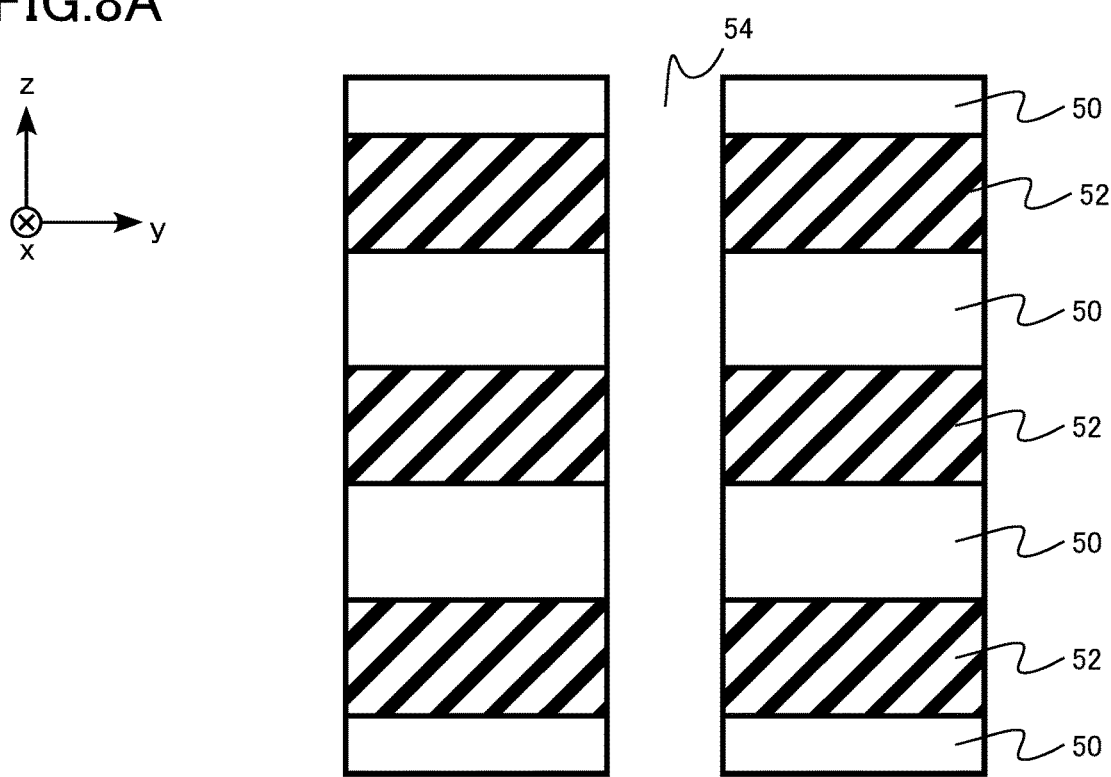
FIGS. 8A and 8B are schematic cross-sectional views illustrating the method of manufacturing the memory device of the first embodiment.
Figure 8B:
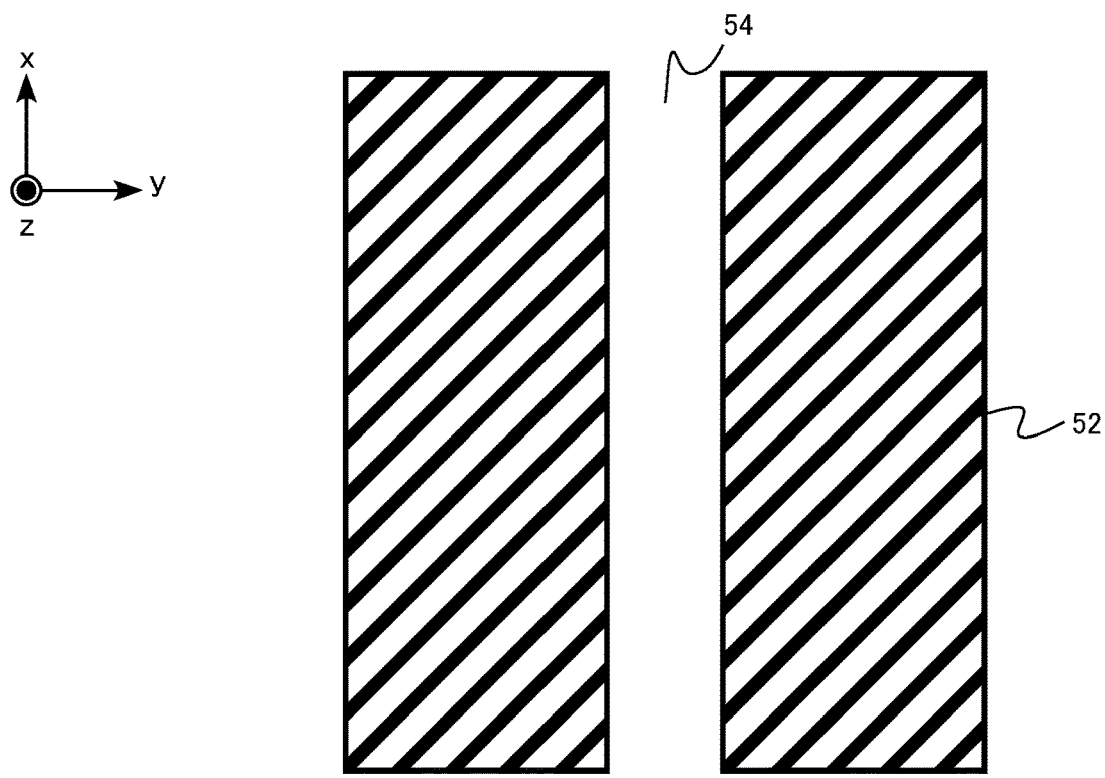

A groove 54 is formed in the silicon oxide layer 50 and the silicon nitride layer 52 (FIGS. 8A and 8B). The groove 54 is formed by, for example, a lithography method and a reactive ion etching (RIE) method.

Figure 9A:
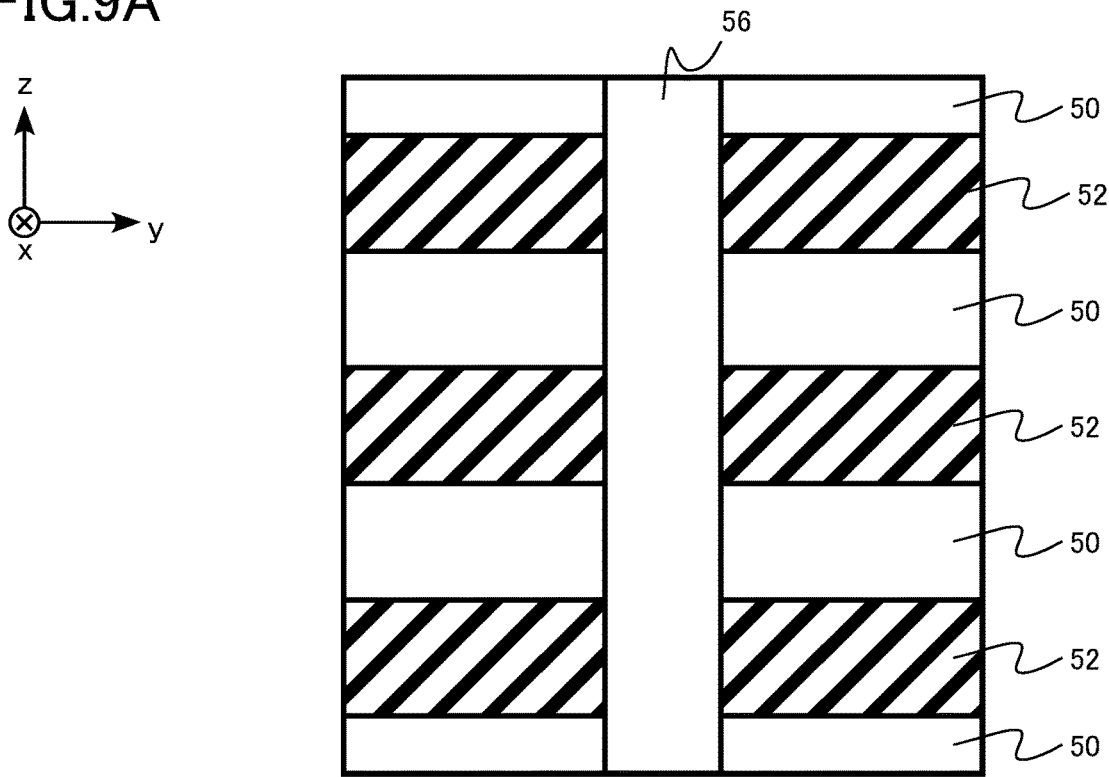
FIGS. 9A and 9B are schematic cross-sectional views illustrating the method of manufacturing the memory device of the first embodiment.
Figure 9B:
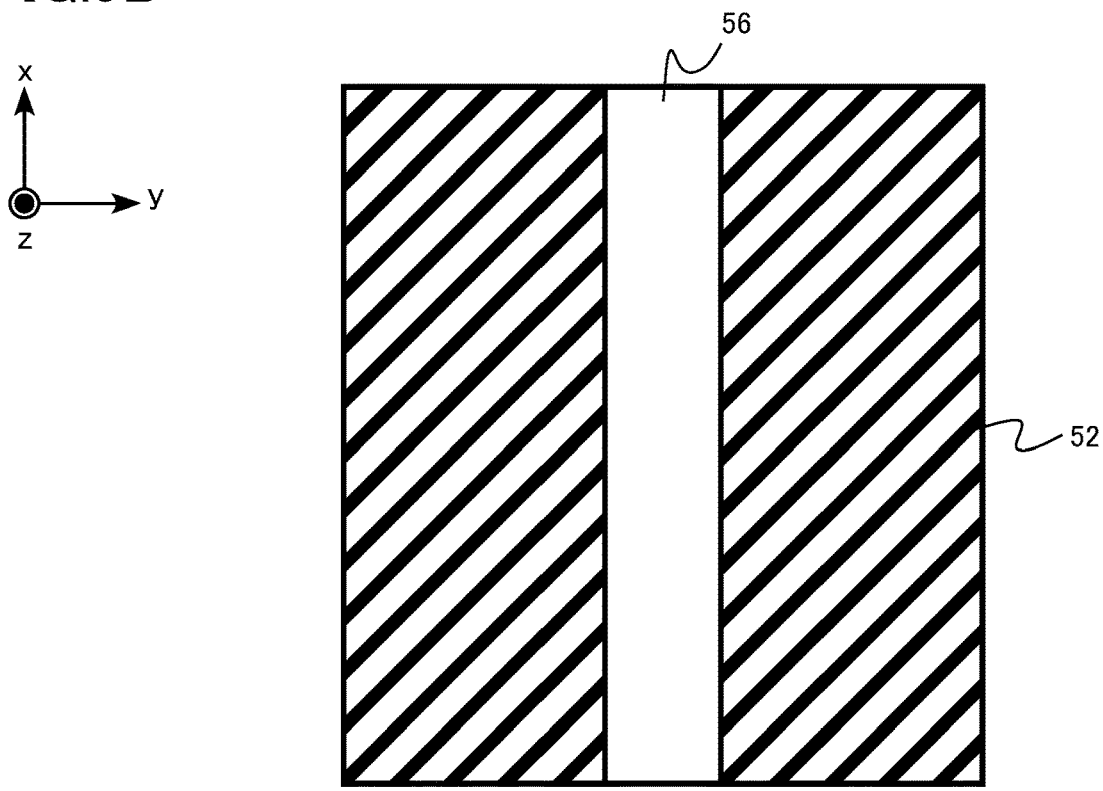

A silicon oxide film 56 is buried in the groove 54 (FIGS. 9A and 9B). The silicon oxide film 56 is formed by, for example, the CVD method.

Figure 10A:
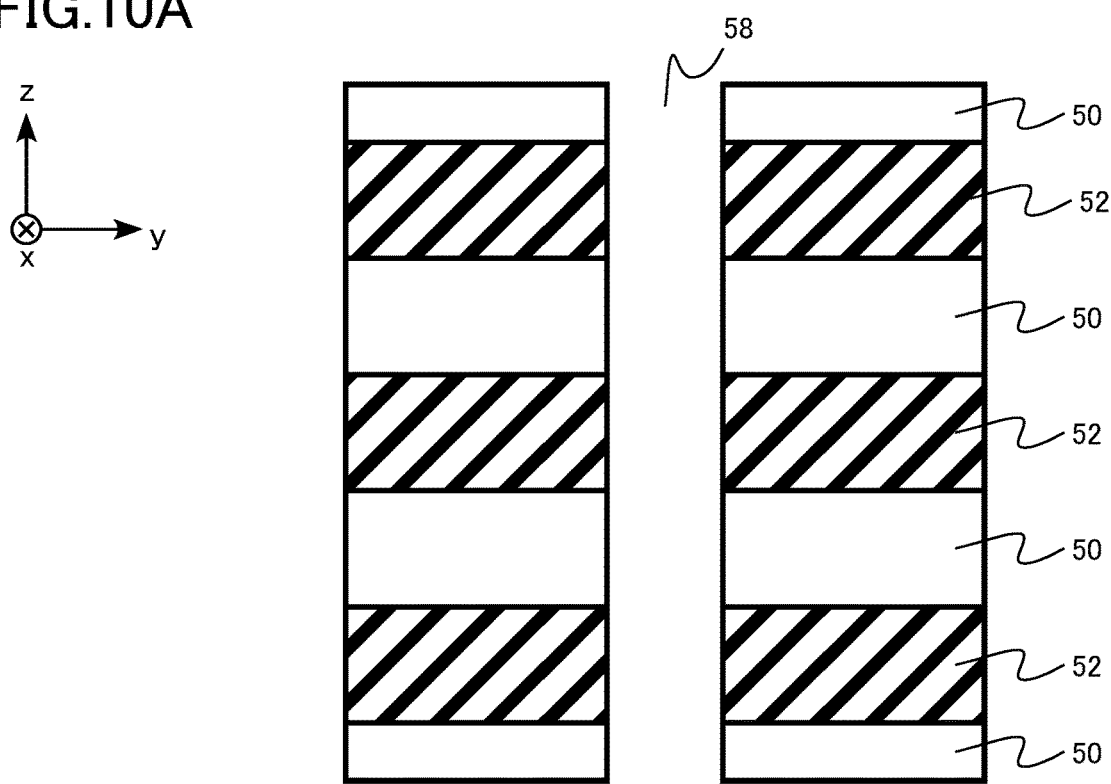
FIGS. 10A and 10B are schematic cross-sectional views illustrating the method of manufacturing the memory device of the first embodiment.
Figure 10B:
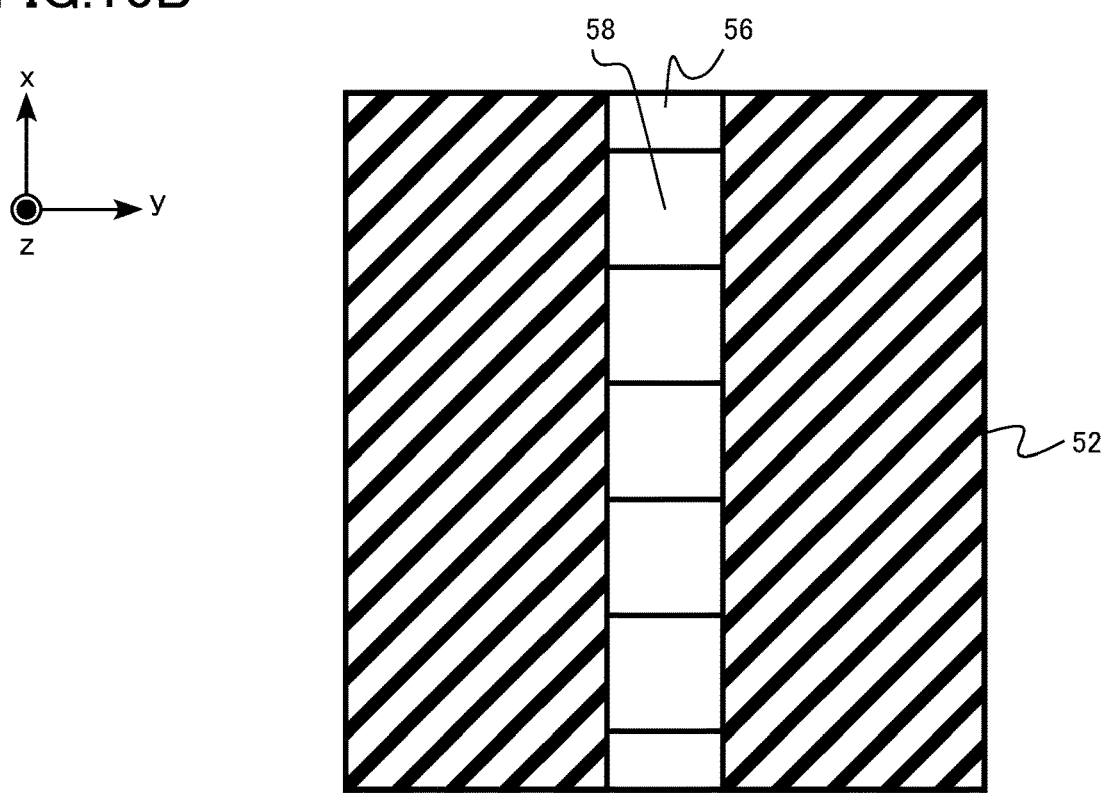

An opening 58 is formed in the silicon oxide film 56 (FIGS. 10A and 10B). The opening 58 is formed by, for example, the lithography method and the RIE method.

Figure 11A:
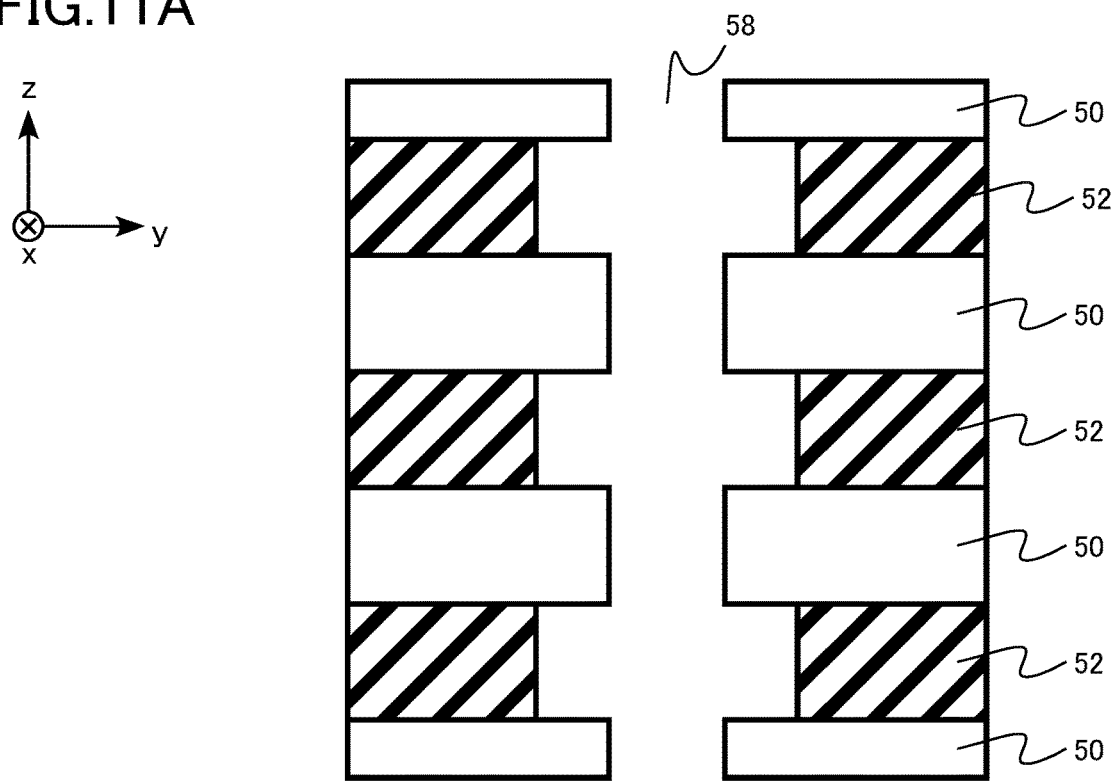
FIGS. 11A and 11B are schematic cross-sectional views illustrating the method of manufacturing the memory device of the first embodiment.
Figure 11B:
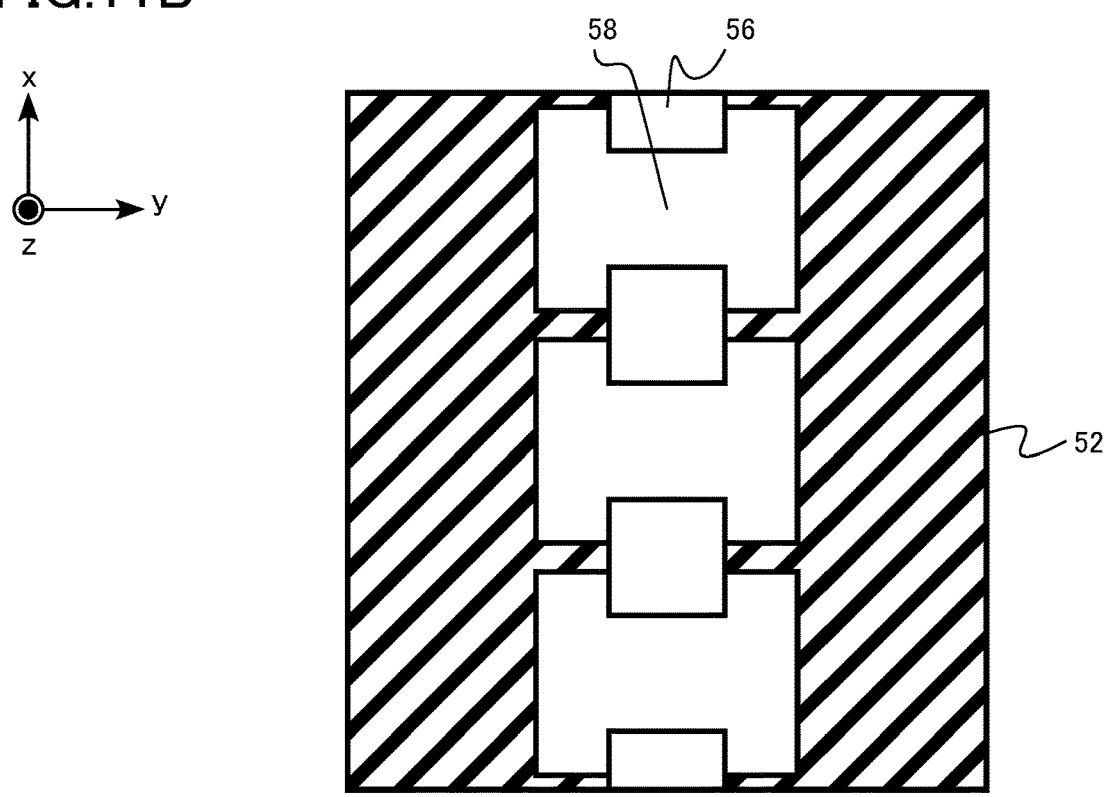

The silicon nitride layer 52 exposed on the inner surface of the opening 58 is selectively recessed by wet etching (FIGS. 11A and 11B). In the wet etching, for example, phosphoric acid solution is used to selectively etch the silicon nitride layer 52 with respect to the silicon oxide layer 50 and the silicon oxide film 56.

Figure 12A:
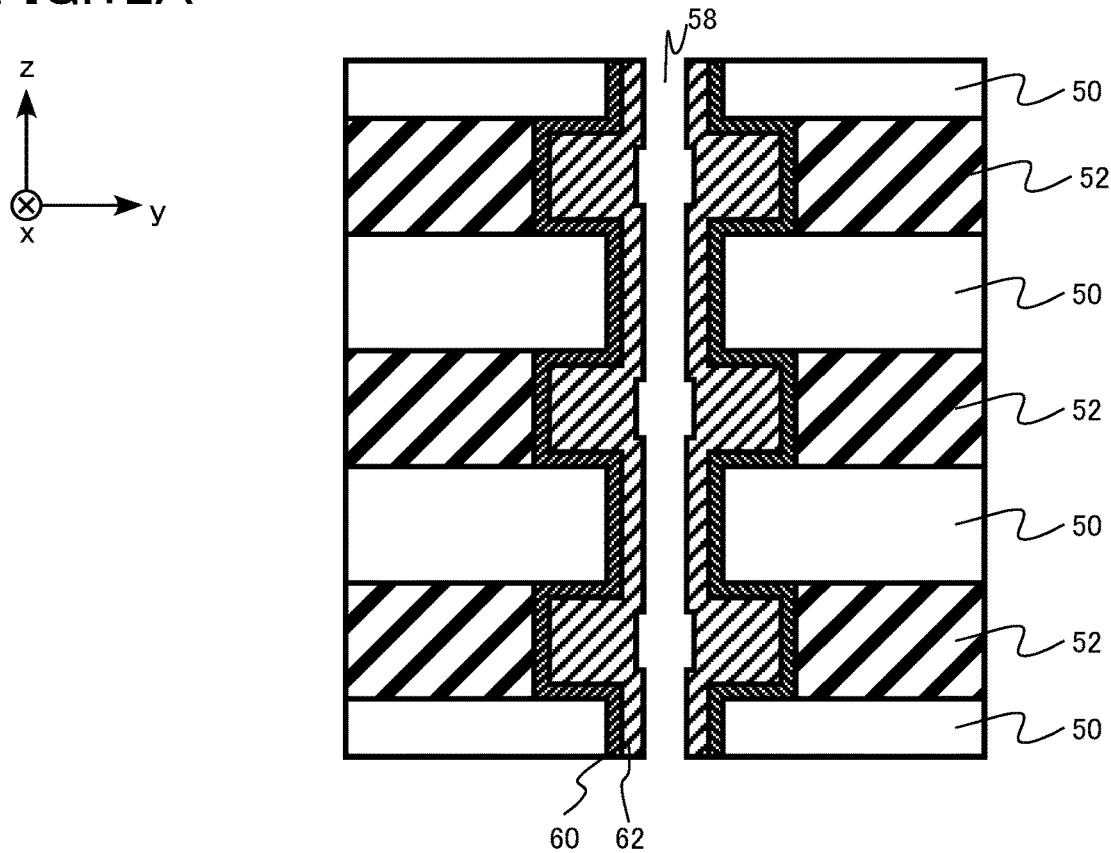
FIGS. 12A and 12B are schematic cross-sectional views illustrating the method of manufacturing the memory device of the first embodiment.
Figure 12B:
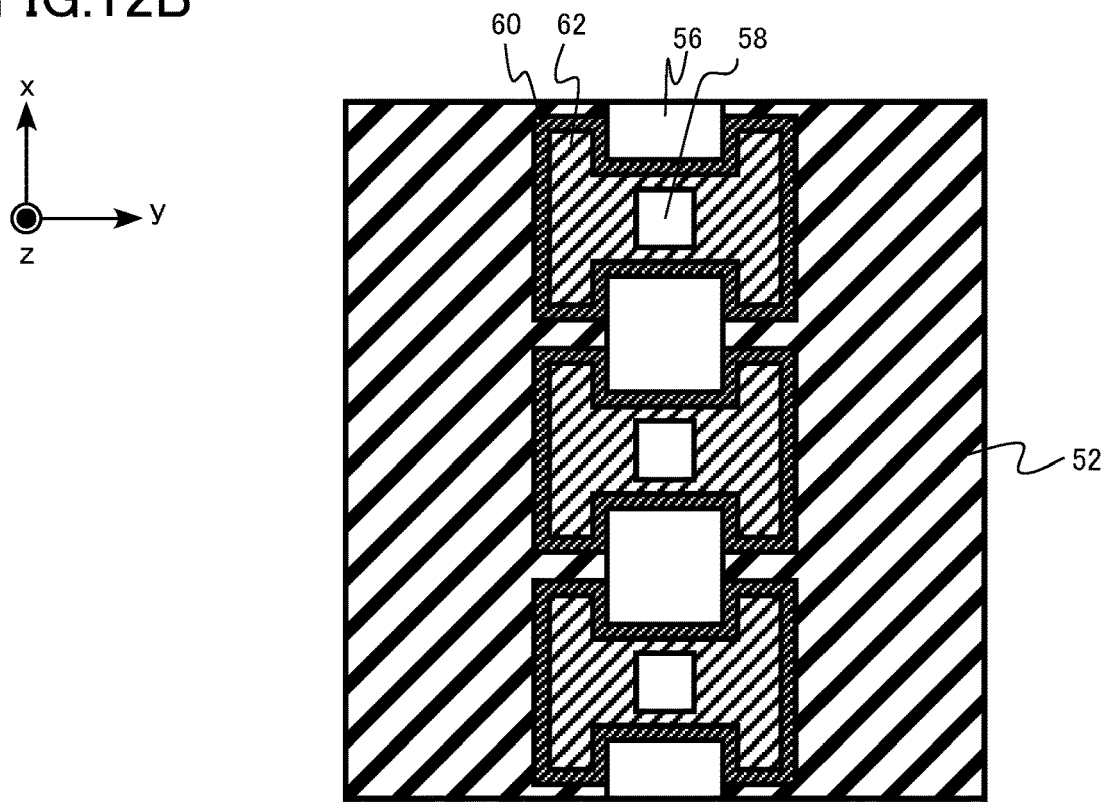

First and second metal oxide films 60 and 62 are formed in the opening 58 and the region obtained by the recession of the silicon nitride layer 52 (FIGS. 12A and 12B). The first and second metal oxide films 60 and 62 are formed by, for example, an atomic layer deposition (ALD) method. A part of the first metal oxide film 60 finally turns to the parallel resistance region 20. A part of the second metal oxide film 62 finally turns to the resistive change layer 10.

Figure 13A:
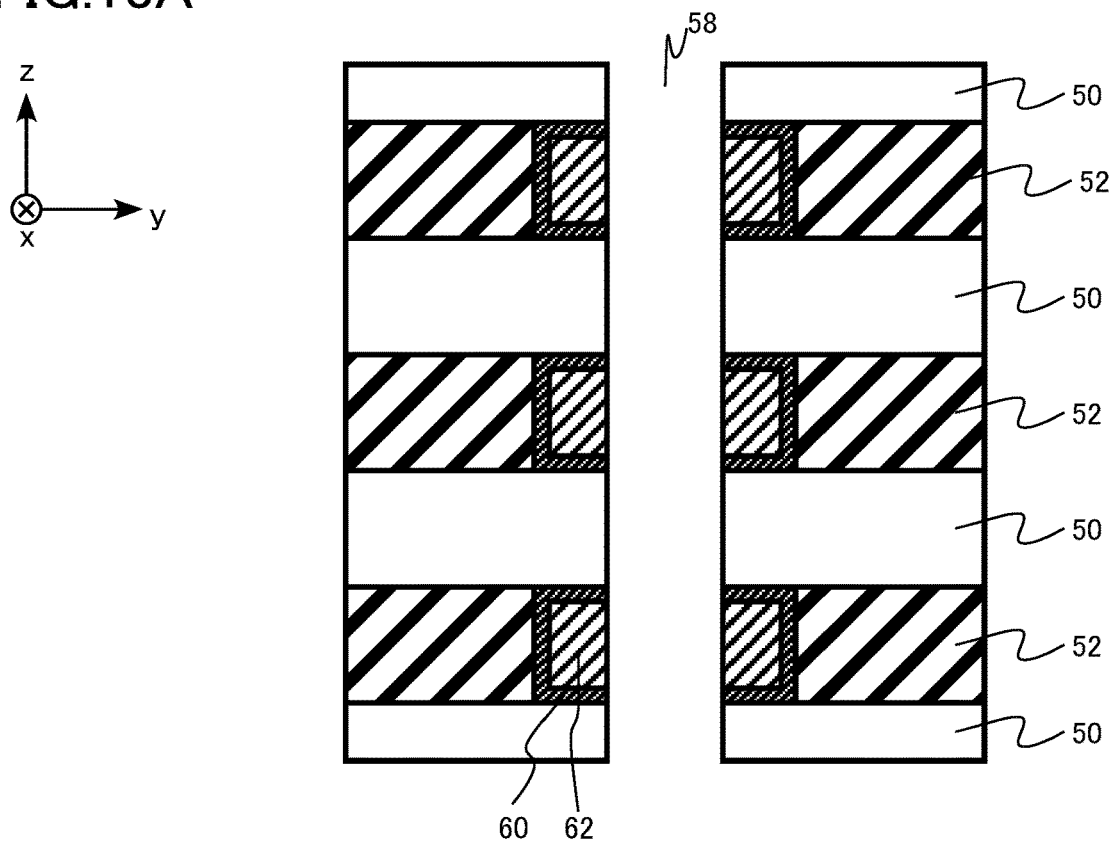
FIGS. 13A and 13B are schematic cross-sectional views illustrating the method of manufacturing the memory device of the first embodiment.
Figure 13B:
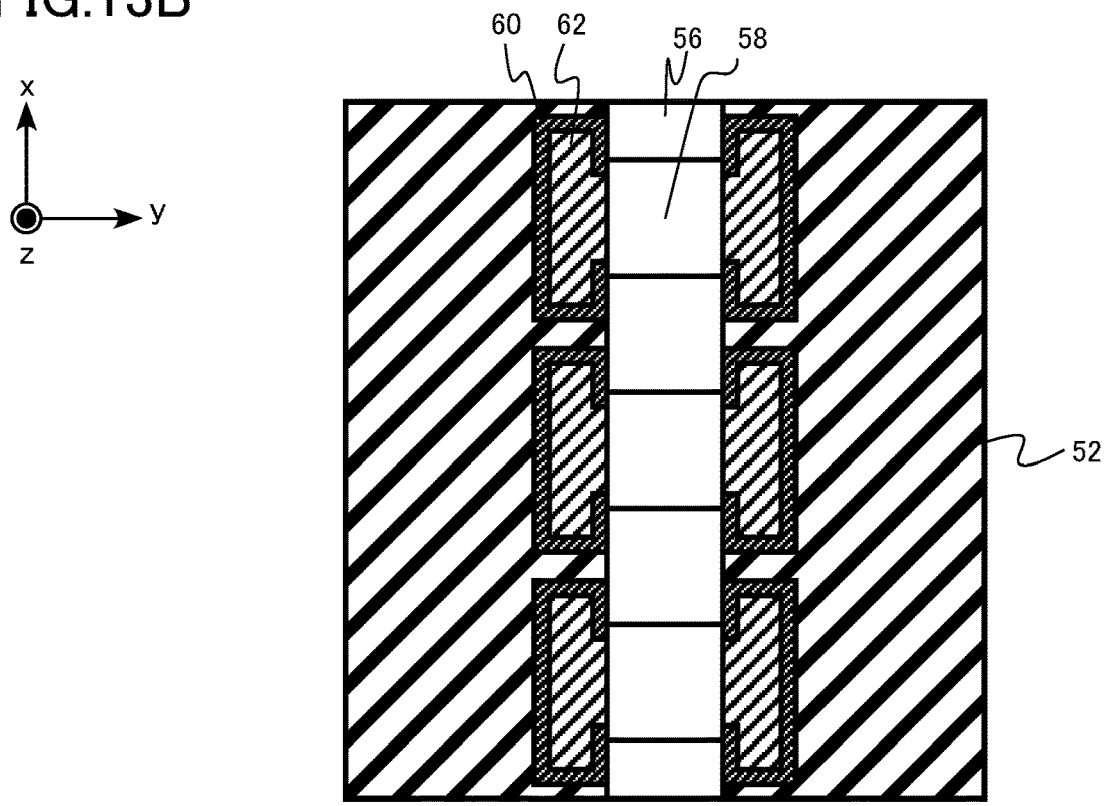

The first and second metal oxide films 60 and 62 on the inner surface of the opening 58 are removed by etching (FIGS. 13A and 13B). The first and second metal oxide films 60 and 62 are removed by etching by, for example, the RIE method.

Figure 14A:
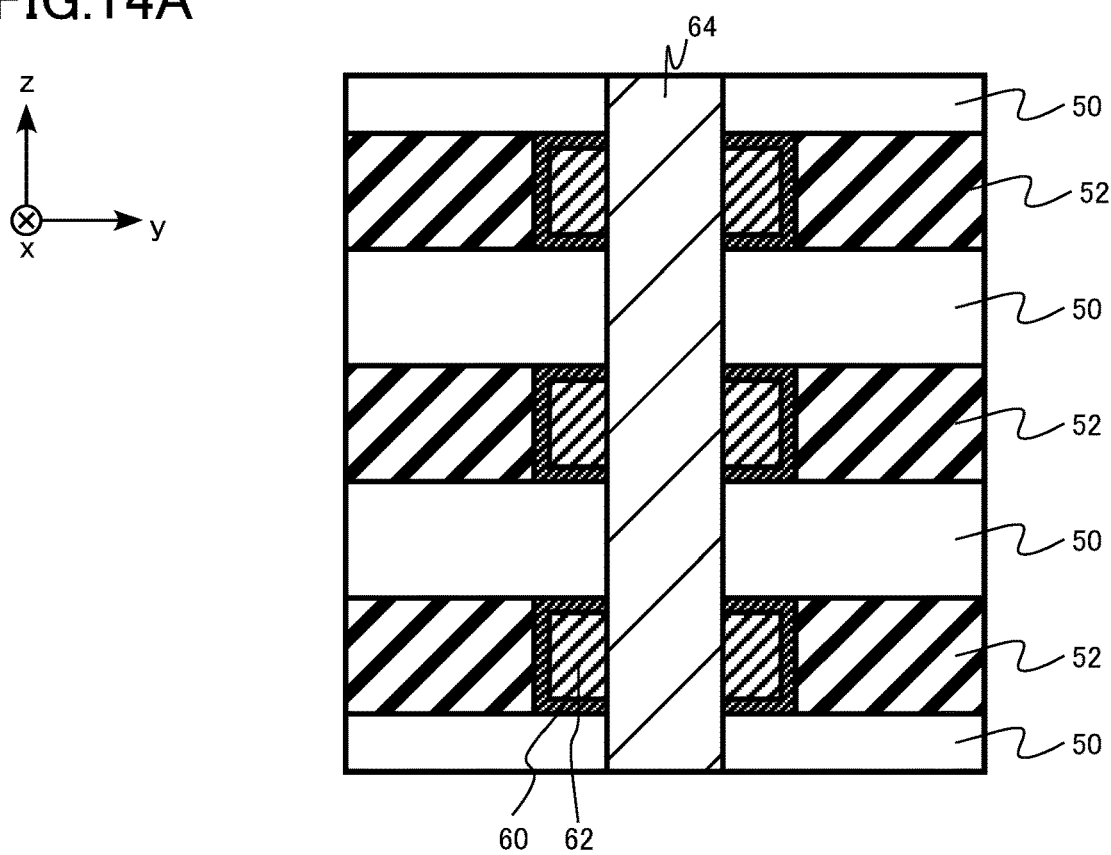
FIGS. 14A and 14B are schematic cross-sectional views illustrating the method of manufacturing the memory device of the first embodiment.
Figure 14B:
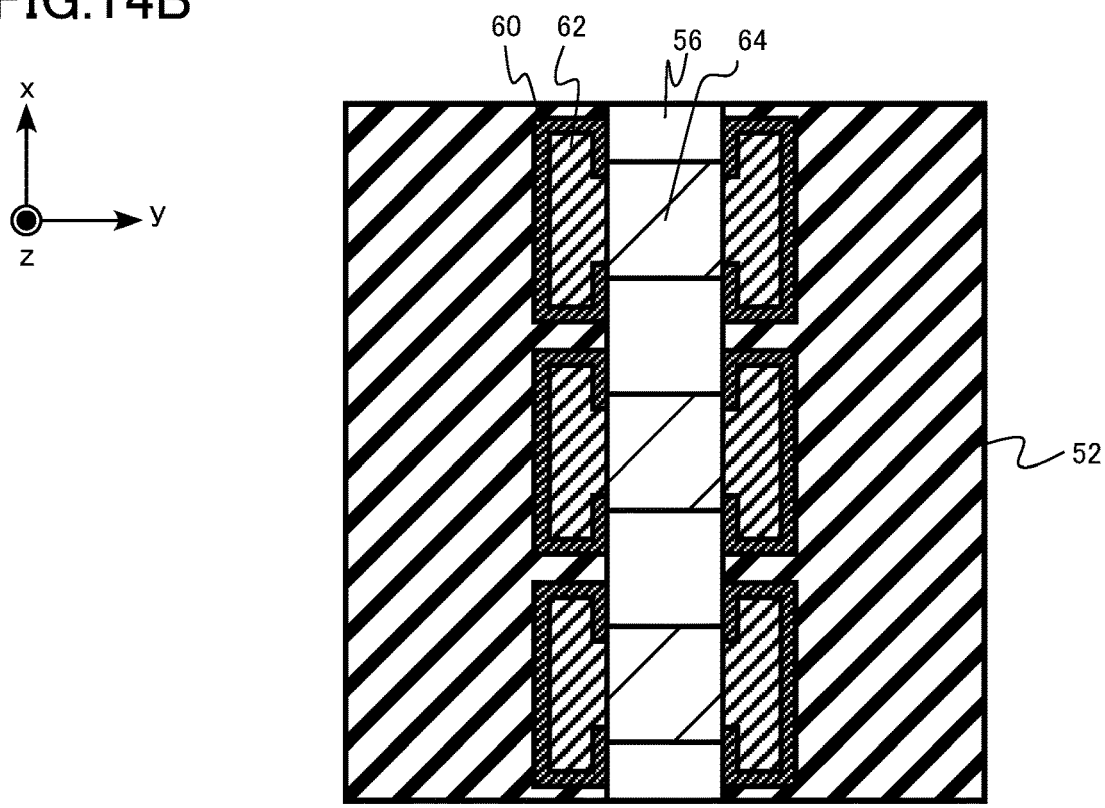

A metal film 64 is buried in the opening 58 (FIGS. 14A and 14B). The metal film 64 is formed by, for example, the CVD method. The metal film 64 finally turns to the local bit line LBL.

Figure 15A:
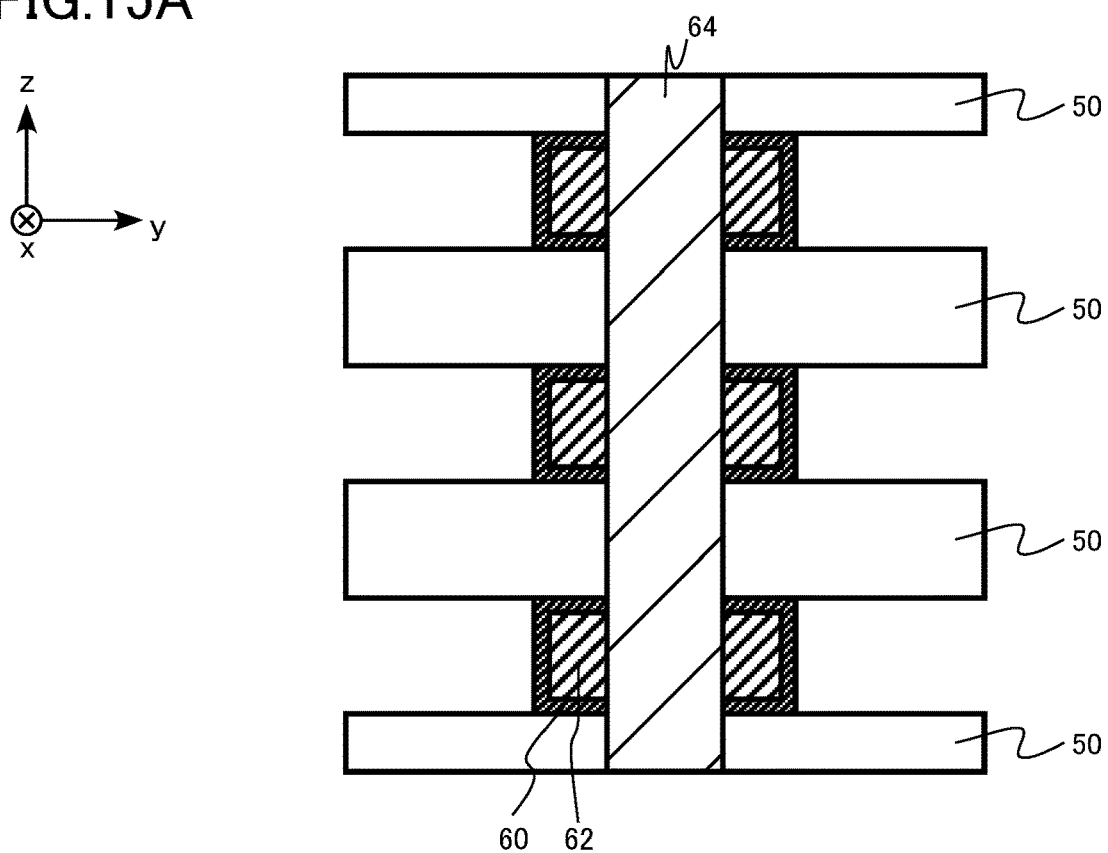
FIGS. 15A and 15B are schematic cross-sectional views illustrating the method of manufacturing the memory device of the first embodiment.
Figure 15B:
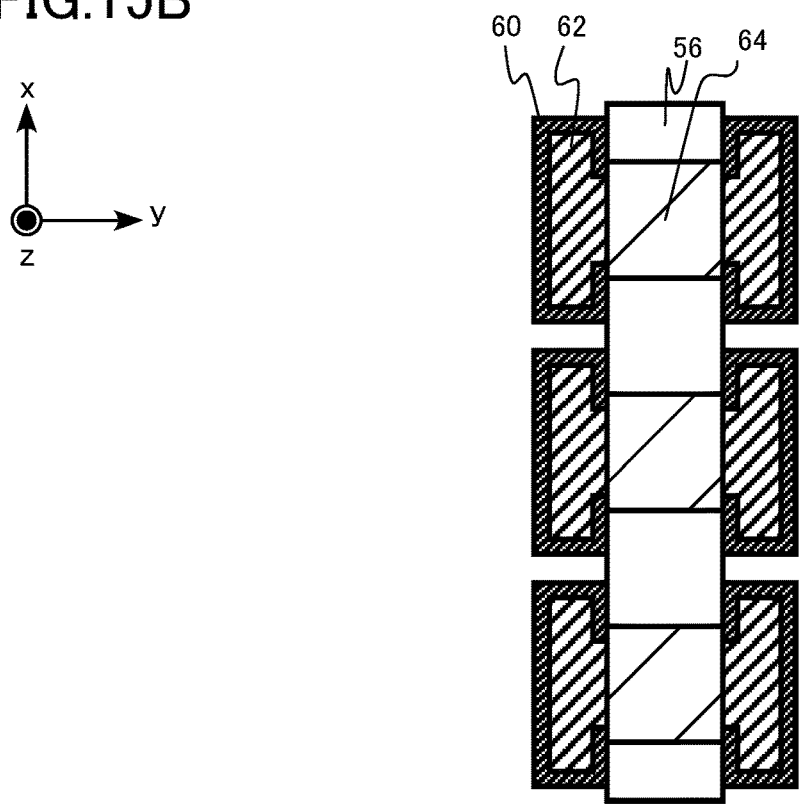

The silicon nitride layer 52 is selectively removed by wet etching using an etching groove (not illustrated) (FIGS. 15A and 15B). In the wet etching, for example, phosphoric acid solution is used to selectively etch the silicon nitride layer 52 with respect to the silicon oxide layer 50, the silicon oxide film 56, and the first metal oxide film 60.

Figure 16A:
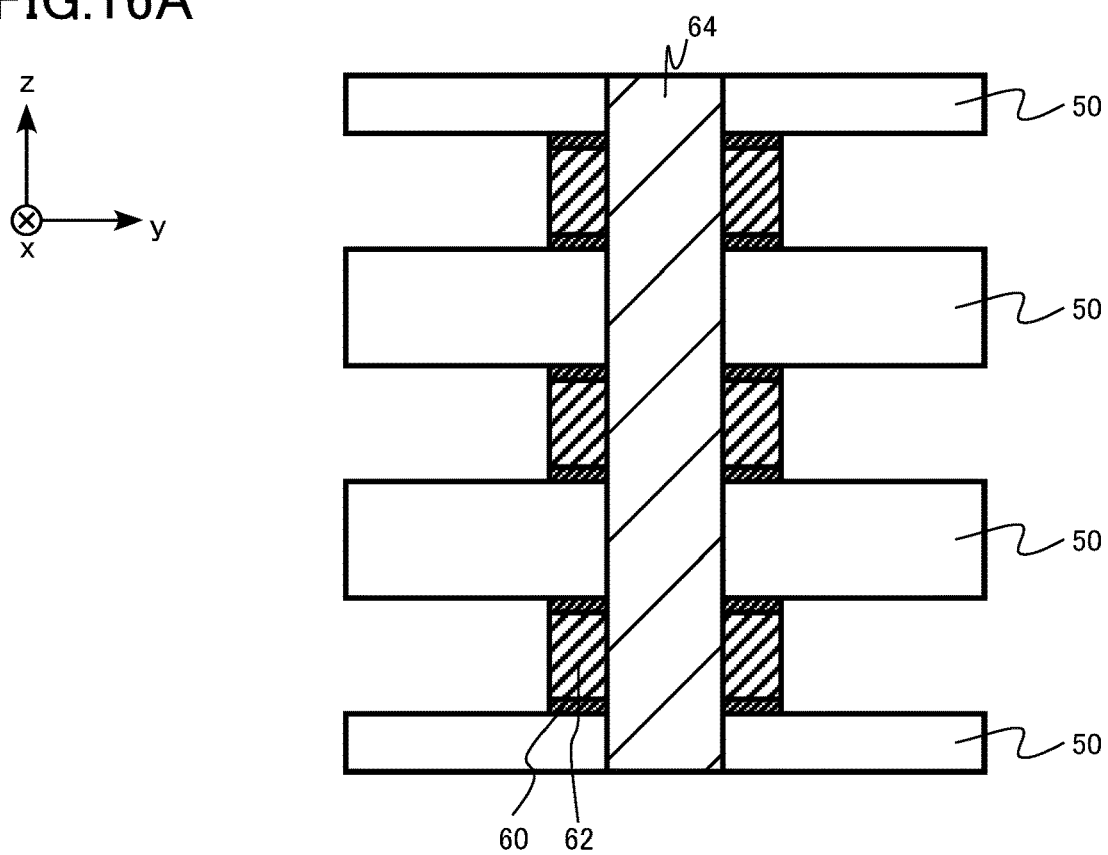
FIGS. 16A and 16B are schematic cross-sectional views illustrating the method of manufacturing the memory device of the first embodiment.
Figure 16B:
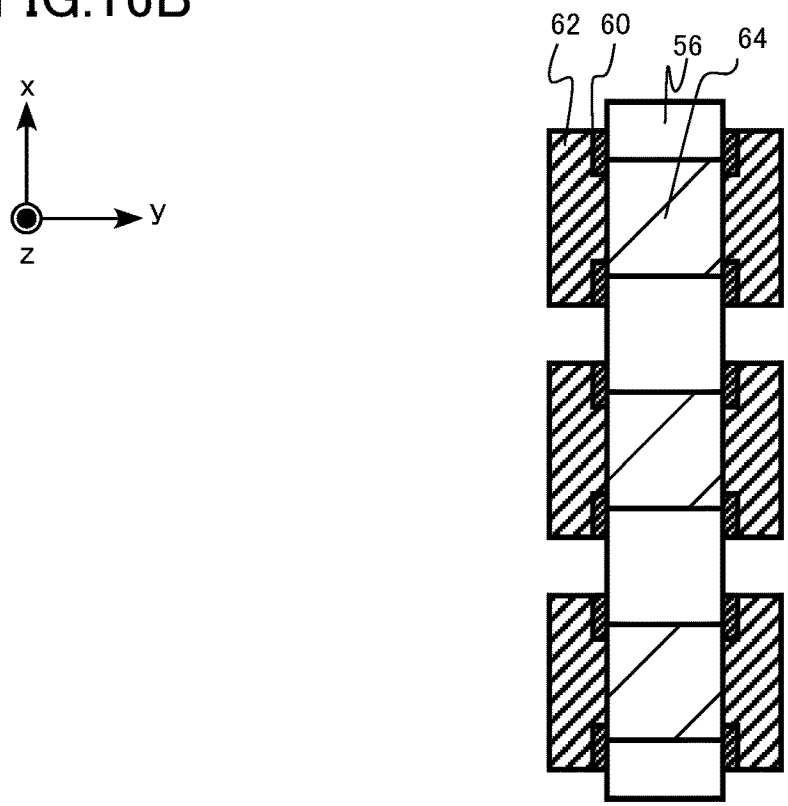

The first metal oxide film 60 is etched so that the second metal oxide film 62 is exposed (FIGS. 16A and 16B). The first metal oxide film 60 is removed by, for example, wet etching.

Figure 17A:
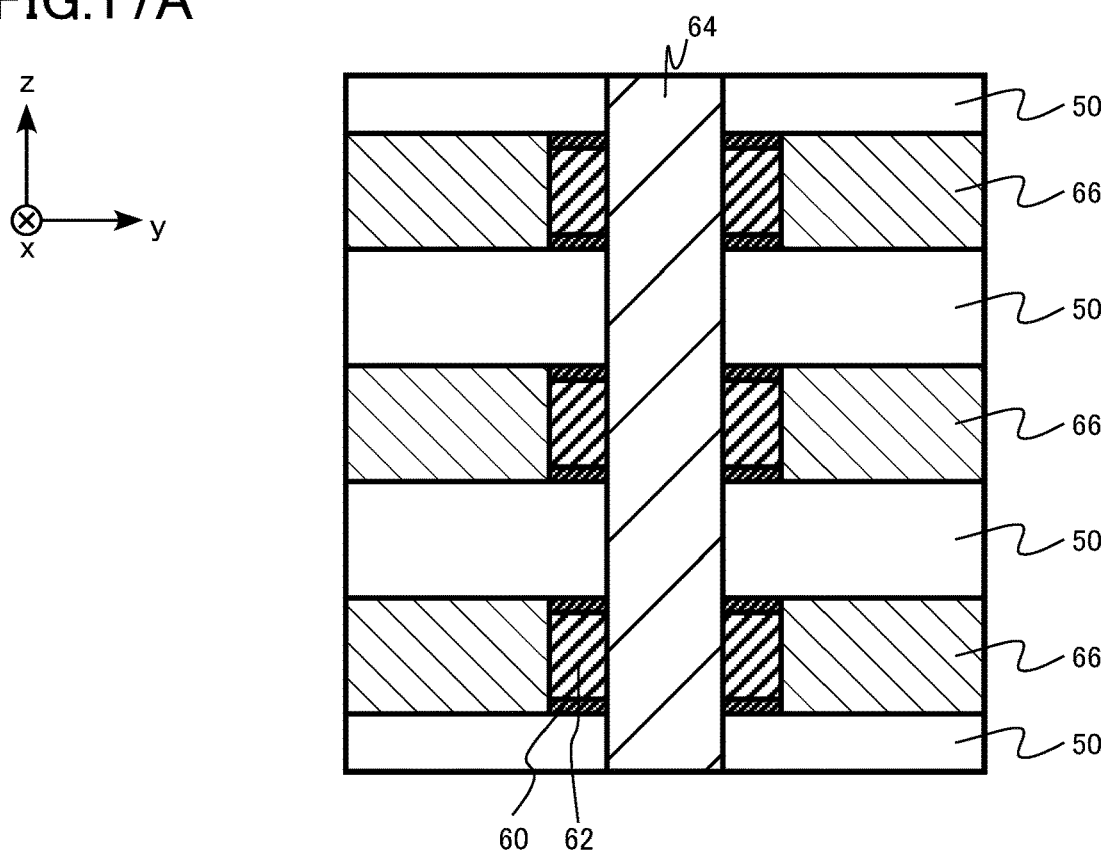
FIGS. 17A and 17B are schematic cross-sectional views illustrating the method of manufacturing the memory device of the first embodiment.
Figure 17B:
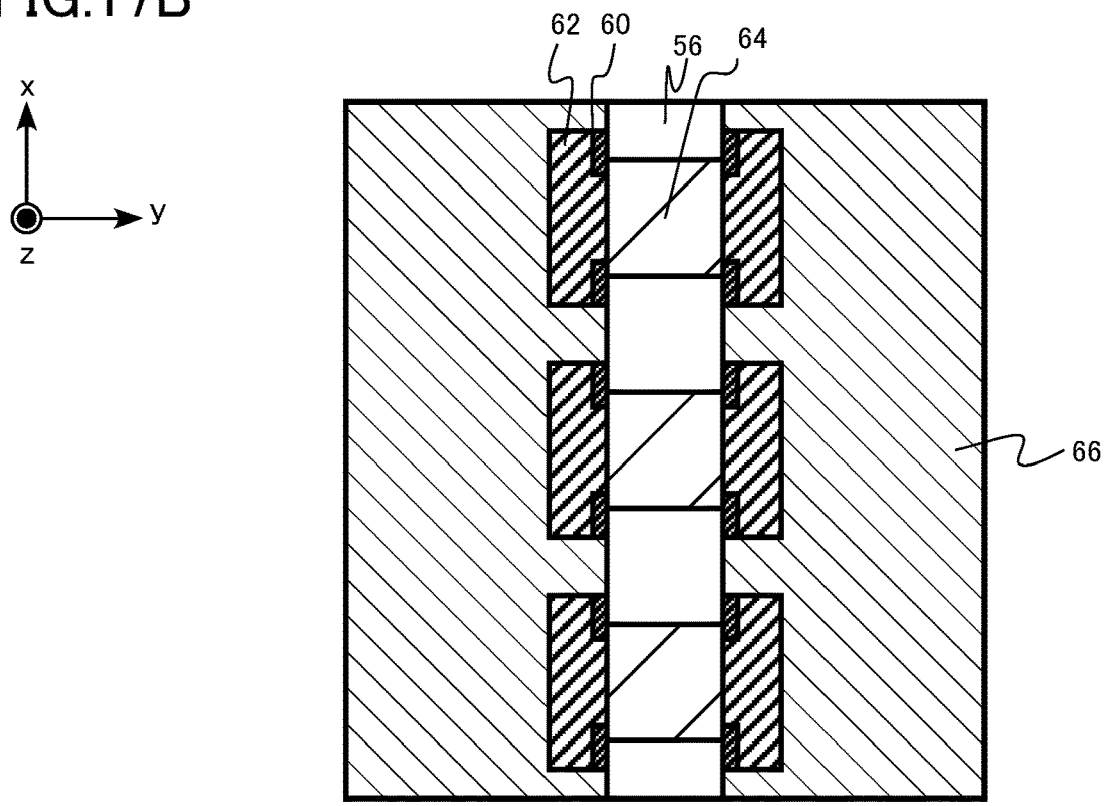

A metal film 66 is formed (FIGS. 17A and 17B). The metal film 66 is formed by, for example, the CVD method. The metal film 66 finally turns to the word line WL.

The memory cell array 101 of the resistive random access memory 100 of the first embodiment is manufactured by the above-described method of manufacture.

Functions and effects of the memory device of the first embodiment will now be described.

In a two-terminal resistive random access memory, current is flowed by applying a predetermined voltage to a memory cell including a resistive change element, and the resistive change element is changed from a high resistance state to a low resistance state or from the low resistance state to the high resistance state. Changing the resistive change element from the high resistance state to the low resistance state is referred to as a set operation. Changing the resistive change element from the low resistance state to the high resistance state is referred to as a reset operation. For example, when the high resistance state is defined as data "1" and the low resistance state is defined as data "0", the memory cell can store one-bit data of "1" and "0".

The data stored in the memory cell MC is determined by applying a predetermined read voltage (Vread) and detecting the current flowing in the memory cell MC. In order to guarantee the reliability of the resistive random access memory, suppression of variation of the current flowing in the memory cell MC is required.

The current flowing in the memory cell MC with the resistive change element in the low resistance state at the time when the read voltage Vread is applied to the memory cell MC is hereinafter referred to as on-current (Ion), and the current flowing in the memory cell MC with the resistive change element in the high resistance state is referred to as off-current (Ioff). In addition, the voltage to be applied to the memory cell MC in the set operation is referred to as a set voltage (Vset). The voltage to be applied to the memory cell MC in the reset operation is referred to as a reset voltage (Vreset). The set voltage (Vset) is also referred to as a write voltage.

Figure 18A:
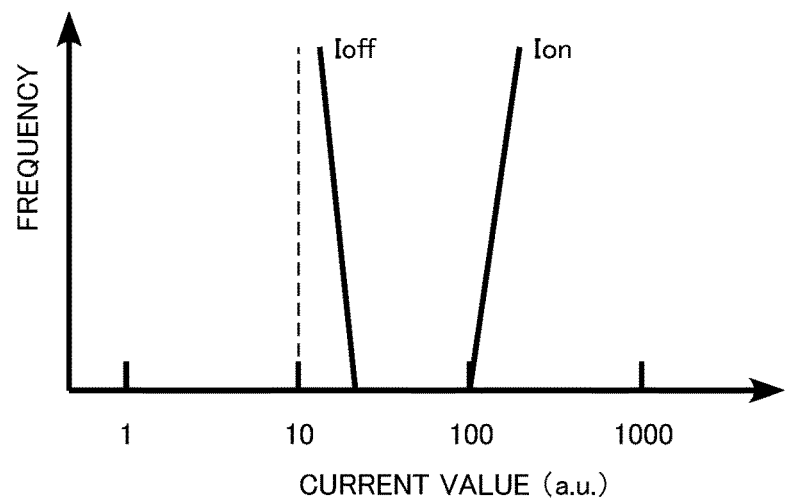
FIGS. 18A, 18B, and 18C are explanatory diagrams of functions and effects of the first embodiment.
Figure 18B:
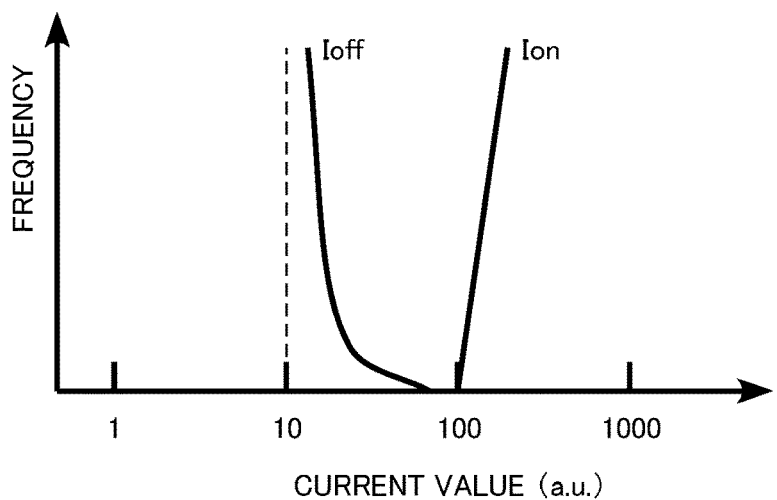
Figure 18C:
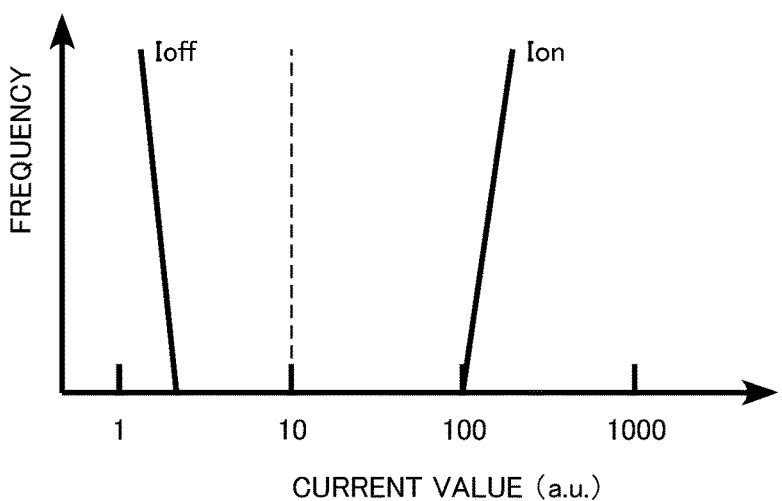

FIGS. 18A, 18B, and 18C are explanatory diagrams of the functions and effects of the first embodiment. FIGS. 18A, 18B, and 18C illustrate distributions of the on-current Ion and off-current Ioff of the memory cell MC. The horizontal axis indicates a current value of any unit.

FIG. 18A illustrates the distributions of desired on-current Ion and off-current Ioff. The distributions of both the on-current Ion and the off-current Ioff fall within a narrow current range.

FIG. 18B illustrates the cumulative frequency distributions of the on-current Ion and off-current Ioff after a read disturb endurance test. Repeating the reading of the memory cell MC may increase, for example, the off-current Ioff of a part of the memory cell MC, resulting in occurrence of a tail in the distribution of the off-current Ioff. Such degradation of the memory cell MC is referred to as read disturb. The read disturb may cause inversion of data of the memory cell MC in which the off-current Ioff is increased.

FIG. 18C illustrates the distributions of the on-current Ion and off-current Ioff after addressing the read disturb. For example, as illustrated in FIG. 18C, the distribution of low off-current Ioff can be achieved by raising the reset voltage Vreset to be applied to the memory cell MC in the reset operation and deeply resetting the memory cell MC. The occurrence of a tail in the distribution of the off-current Ioff due to the read disturb can be suppressed by achieving the distribution of the low off-current Ioff.

When the off-current Ioff is too low, however, the off-current Ioff may fall below a lower limit value of detectable current in the sense amplifier circuit of the resistive random access memory. This case is not preferred since the current level of the memory cell MC in the off-state cannot be determined and the off-state of the memory cell MC cannot be guaranteed. For example, assuming that the current value of the lower limit of the detectable current in the sense amplifier circuit is set as 10, in the case of FIG. 18C, the current level of the memory cell MC in the off-state cannot be determined.

Figure 19A:
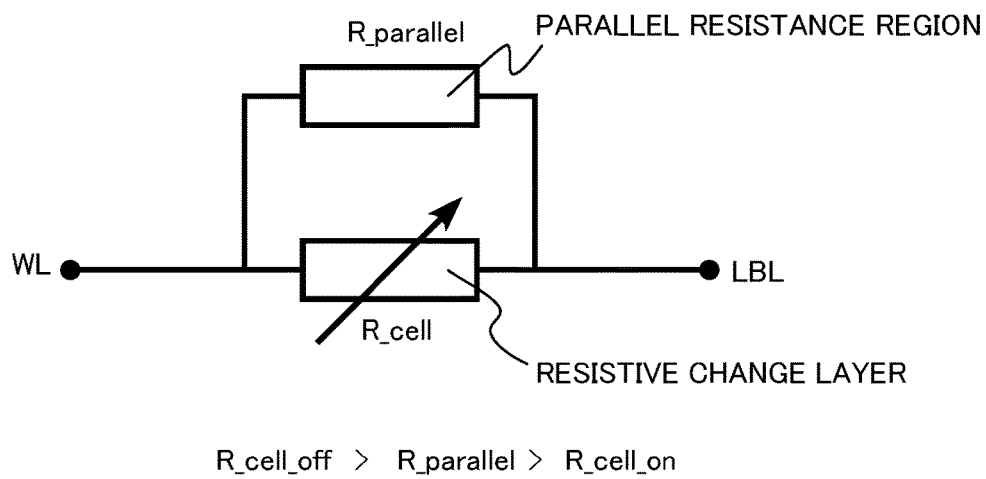
FIGS. 19A and 19B are explanatory diagrams of the functions and effects of the first embodiment.
Figure 19B:
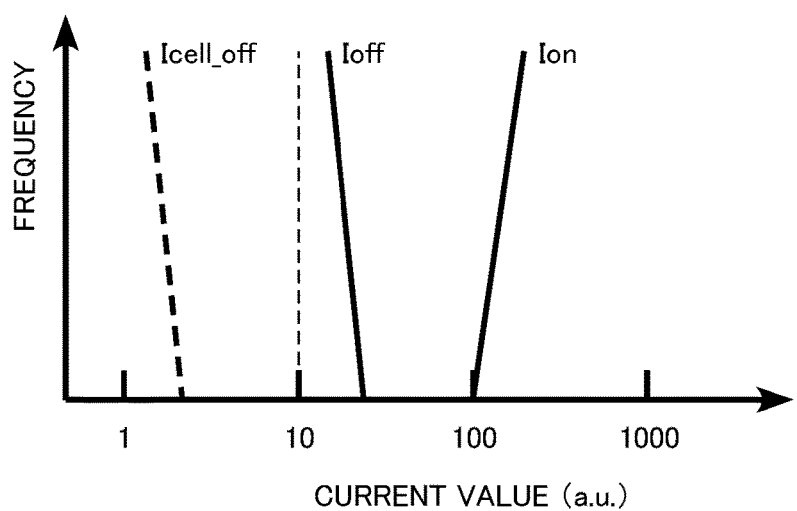

FIGS. 19A and 19B are explanatory diagrams of the functions and effects of the first embodiment. FIG. 19A is an equivalent circuit diagram of the memory cell MC of the first embodiment. FIG. 19B illustrates the distributions of the on-current Ion and the off-current Ioff of the memory cell MC of the first embodiment.

In addition to the resistive change layer 10, the resistive random access memory 100 of the first embodiment includes the parallel resistance region 20 between the word line WL and the local bit line LBL. The parallel resistance region 20 is in contact with the word line WL and the local bit line LBL. As illustrated in FIG. 19A, the resistance of the resistive change layer 10 and that of the parallel resistance region 20 are connected in parallel between the word line WL and the local bit line LBL.

When a predetermined read voltage (Vread) is applied between the word line WL and the local bit line LBL, the parallel resistance region 20 has a resistance (R parallel) lower than a resistance (R cell off) of the resistive change layer 10 in the high resistance state and a resistance (R parallel) higher than a resistance (R cell on) of the resistive change layer 10 in the low resistance state.

As a result, the level of the off-current (Ioff) is determined by the resistance of the parallel resistance region 20 lower than that of the resistive change layer 10 in the high resistance state in the memory cell MC of the resistive random access memory 100. In other words, the off-current (Ioff) increases compared to the off-current (Icell off in FIG. 19B) in the case where the parallel resistance region 20 is not provided.

Since the parallel resistance region 20 has a resistance higher than that of the resistive change layer 10 in the low resistance state, the on-current (Ion) does not change depending on the presence or absence of the parallel resistance region 20.

For example, as illustrated in FIG. 19B, the off-current (Icell off) of the resistive change layer 10 in the high resistance state is decreased by raising the reset voltage Vreset to be applied to the memory cell MC in the reset operation and deeply resetting the memory cell MC. The occurrence of a tail in the distribution of the off-current Ioff due to the read disturb can thus be suppressed.

As illustrated in FIG. 19B, the off-current (Ioff) can be increased beyond the lower limit value of the detectable current in the sense amplifier circuit by providing the parallel resistance region 20. This enables determination of a current level of the memory cell MC in the off-state. The off-state of the memory cell MC can thus be guaranteed.

According to the resistive random access memory 100 of the first embodiment, the off-state of the memory cell MC can be guaranteed and variation of current flowing in the memory cell MC can be suppressed by providing the parallel resistance region 20. A resistive random access memory capable of improving reliability can thus be achieved.

The first metal oxide contained in the parallel resistance region 20 preferably has a band gap of equal to or more than 4 eV and equal to or less than 7 eV in terms of achieving appropriate off-current. In addition, the first metal oxide preferably has a band gap smaller than that of the second metal oxide contained in the resistive change layer 10 in terms of achieving the appropriate off-current. In addition, the first metal oxide preferably has a band gap smaller than that of the third metal oxide contained in the resistive change layer 10 in terms of achieving the appropriate off-current.

The first metal oxide contained in the parallel resistance region 20 preferably has a dielectric constant of equal to or more than 20 and equal to or less than 30 in terms of achieving the appropriate off-current. The first metal oxide contained in the parallel resistance region 20 preferably has a dielectric constant greater than that of the second metal oxide contained in the resistive change layer 10 in terms of achieving the appropriate off-current. In addition, the first metal oxide contained in the parallel resistance region 20 preferably has a dielectric constant greater than that of the third metal oxide contained in the resistive change layer 10 in terms of achieving the appropriate off-current.

The parallel resistance region 20 preferably has a width (d2 in FIG. 5B) in the x direction greater than a width (d3 in FIG. 5B) of the local bit line LBL in the x direction in terms of achieving the appropriate off-current.

The parallel resistance region 20 has a cross-sectional area in a plane perpendicular to the direction from the word line WL to the local bit line LBL, that is, the plane (xz plane) perpendicular to the y direction, the cross-sectional area being preferably equal to or more than 0.33 times and equal to or less than one time, and more preferably equal to or more than 0.4 times and equal to or less than 0.8 times of that of the first metal oxide layer 10a in the plane perpendicular to the y direction. The parallel resistance region 20 has a cross-sectional area in the plane (xz plane) perpendicular to the y direction, the cross-sectional area being preferably equal to or more than 0.33 times and equal to or less than one time, and more preferably equal to or more than 0.4 times and equal to or less than 0.8 times of that of the resistive change layer 10 in the plane perpendicular to the y direction.

The off-current can further be increased by setting the cross-sectional area at equal to or more than the above-described lower limit value. In addition, reduction of resistance due to formation of a filament in the parallel resistance region 20 is suppressed by setting the cross-sectional area at equal to or less than the above-described upper limit value. In addition, increase in the occupied area of the memory cell MC due to the provision of the parallel resistance region 20 is suppressed by setting the cross-sectional area at equal to or less than the above-described upper limit value, whereby scaling-down of the resistive random access memory 100 can be achieved.

In terms of the suppression of filament formation in the parallel resistance region 20 and the scaling-down of the resistive random access memory 100, the parallel resistance region 20 preferably has a width (d4 in FIG. 3B) in the z direction smaller than a width (d5 in FIG. 3B) of the first metal oxide layer 10a in the z direction. In terms of the suppression of filament formation in the parallel resistance region 20 and the scaling-down of the resistive random access memory 100, the parallel resistance region 20 preferably has a width (d4 in FIG. 3B) in the z direction, for example, smaller than a width (d5 in FIG. 3B) of the resistive change layer 10 in the z direction.

The parallel resistance region 20 preferably has the width d4 in the z direction, the width d4 being equal to or more than 0.15 times and equal to or less than 0.5 times of the width d5 of the first metal oxide layer 10a in the z direction. In addition, the parallel resistance region 20 preferably has the width d4 in the z direction, the width d4 being equal to or more than 0.15 times and equal to or less than 0.5 times of the width d5 of the resistive change layer 10 in the z direction.

The off-current can be further increased by setting the width d4 at equal to or more than the above-described lower limit value. In addition, reduction of resistance due to formation of a filament in the parallel resistance region 20 is suppressed by setting the width d4 at equal to or less than the above-described upper limit value. In addition, increase in the occupied area of the memory cell MC due to the provision of the parallel resistance region 20 is suppressed by setting the width d4 at equal to or less than the above-described upper limit value, whereby scaling-down of the resistive random access memory 100 can be achieved.

In terms of suppressing half-selected leak current in a half-selected memory cell MC, when a voltage (Vset/2) of half a predetermined write voltage (set voltage (Vset)) is applied between the word line WL and the local bit line LBL, the parallel resistance region 20 preferably has a resistance higher than that of the resistive change layer 10 in the high resistance state. In terms of achieving the above-described characteristics, the parallel resistance region 20 preferably has current-voltage characteristics of nonlinearity higher than nonlinearity of current-voltage characteristics of the resistive change layer 10 in the off-state.

In terms of suppressing the half-selected leak current in the half-selected memory cell MC, when a voltage (½Vread) of half a predetermined read voltage (Vread) is applied between the word line WL and the local bit line LBL, the parallel resistance region 20 preferably has a resistance higher than that of the resistive change layer 10 in the high resistance state. In terms of achieving the above-described characteristics, the parallel resistance region 20 preferably has current-voltage characteristics of nonlinearity higher than nonlinearity of current-voltage characteristics of the resistive change layer 10 in the off-state.

In terms of suppressing the half-selected leak current in the half-selected memory cell MC, when a voltage (Vreset/2) of half a predetermined reset voltage (Vreset) is applied between the word line WL and the local bit line LBL, the parallel resistance region 20 preferably has a resistance higher than that of the resistive change layer 10 in the high resistance state. In terms of achieving the above-described characteristics, the parallel resistance region 20 preferably has current-voltage characteristics of nonlinearity higher than nonlinearity of current-voltage characteristics of the resistive change layer 10 in the off-state.

As described above, according to the first embodiment, a resistive random access memory capable of improving reliability can be achieved by providing the parallel resistance region.

Second Embodiment

A memory device of a second embodiment is similar to that of the first embodiment except that the memory device of the second embodiment further includes a second region. The second region is provided at one of a position between a first conductive layer and a first layer and a position between a second conductive layer and the first layer, includes a first metal oxide, and is in contact with a first region. In addition, the memory device of the second embodiment is similar to that of the first embodiment except that the memory device of the second embodiment further includes the second region. The second region is provided at one of a position between the first conductive layer and a resistive change element and a position between the second conductive layer and the resistance resistive change element, includes the first metal oxide, and is in contact with the first region. The description overlapping with the first embodiment will be partially omitted below.

A memory cell array of a resistive random access memory of the second embodiment has three-dimensional structure in which memory cells MC are sterically disposed. The resistive random access memory of the second embodiment includes two terminals. The resistive random access memory is of a filament type, and changes the resistance of the resistive change element by, for example, generating a filament having oxygen deficiency to the resistive change element by applying voltage.

Figure 20A:
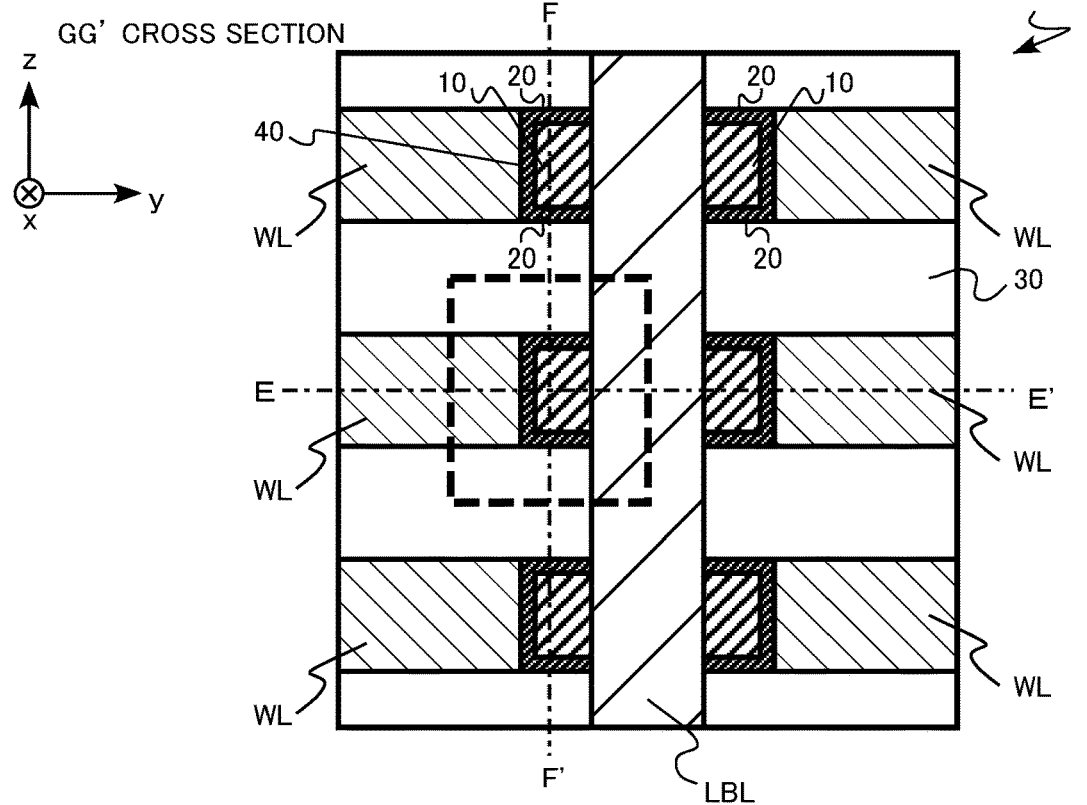
FIGS. 20A and 20B are schematic cross-sectional views of a memory cell array of a memory device of a second embodiment.
Figure 20B:
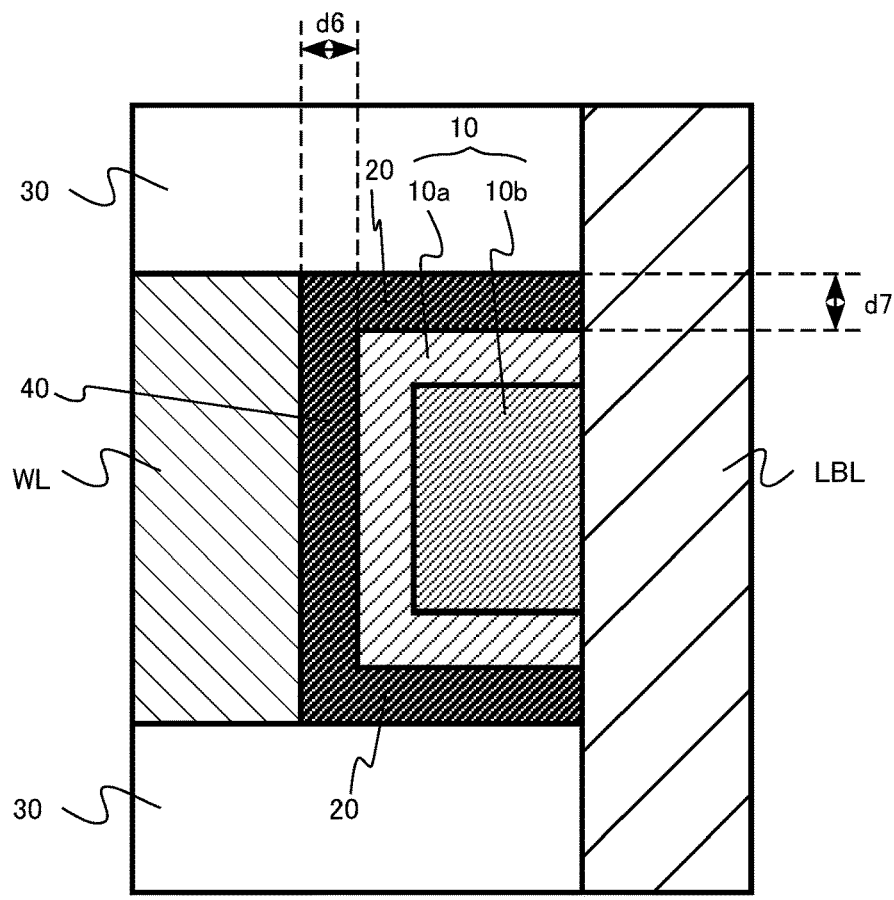

FIGS. 20A and 20B are schematic cross-sectional views of the memory cell array of the memory device of the second embodiment. FIG. 20A is a yz cross-sectional view of a memory cell array 201. FIG. 20A illustrates a GG' cross section of FIG. 21A. FIG. 20B is an enlarged view of a part of FIG. 20A. A region surrounded by a dashed line in FIG. 20A corresponds to one memory cell MC.

Figure 21A:
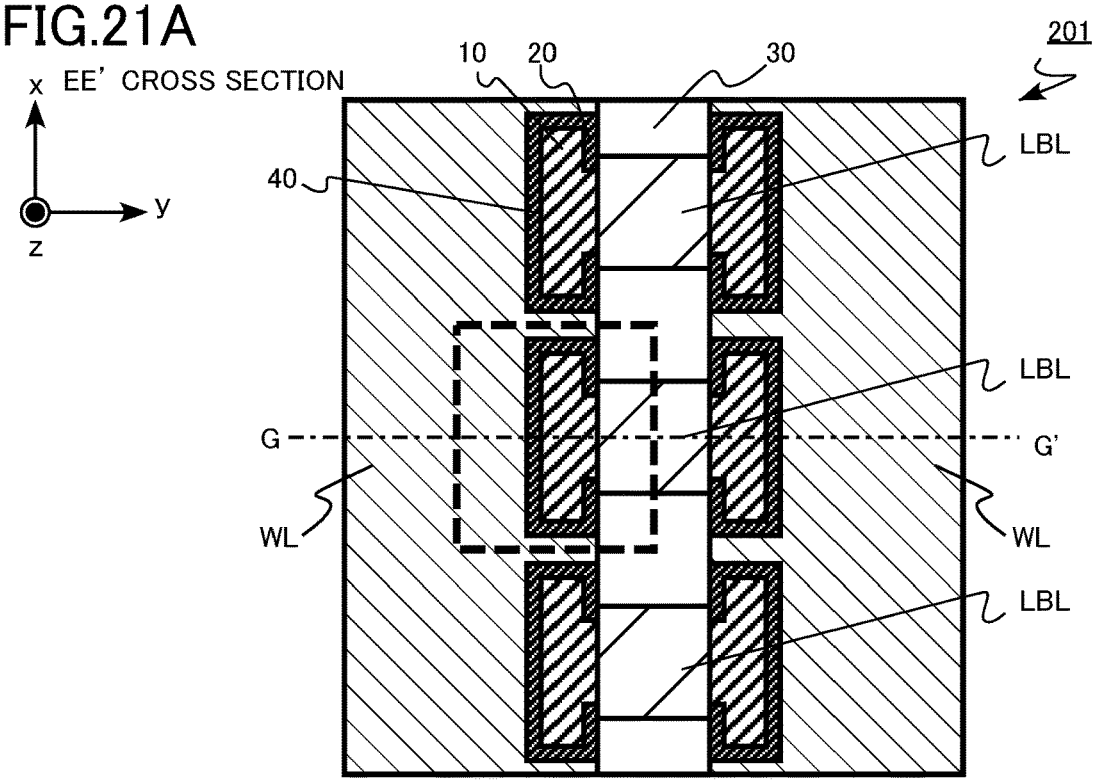
FIGS. 21A and 21B are schematic cross-sectional views of the memory cell array of the memory device of the second embodiment.
Figure 21B:
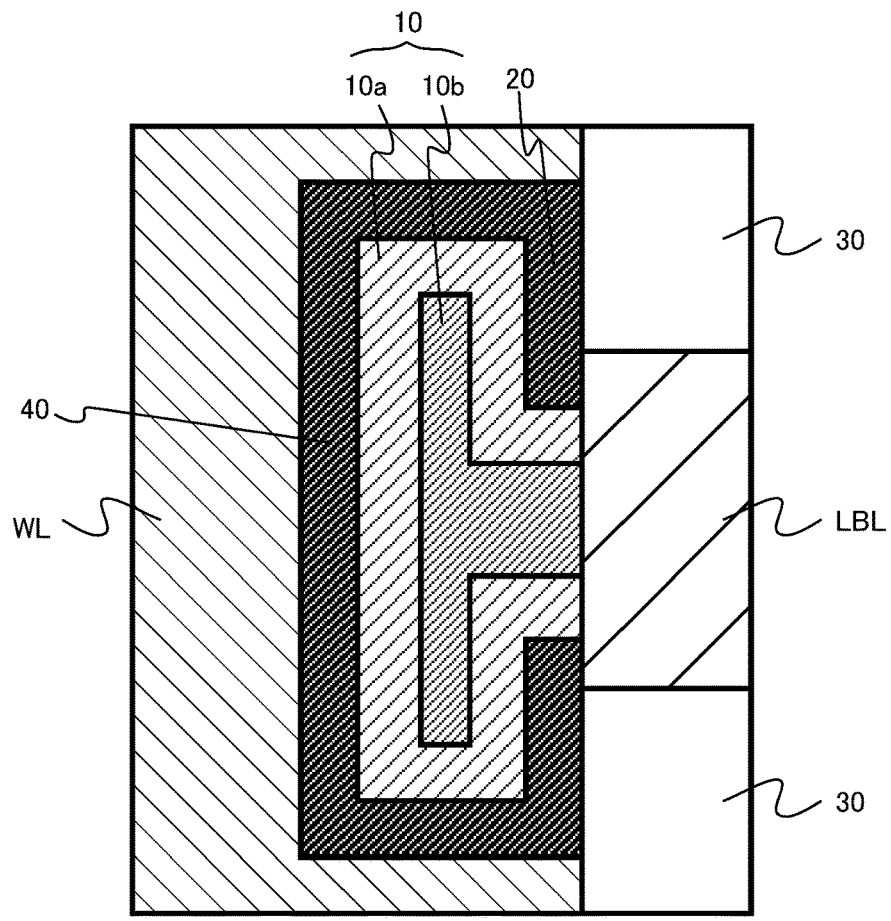

FIGS. 21A and 21B are schematic cross-sectional views of the memory cell array of the memory device of the second embodiment. FIG. 21A is an xy cross-sectional view of the memory cell array 201. FIG. 21A illustrates an EE' cross section of FIG. 20A. FIG. 21B is an enlarged view of a part of FIG. 21A. A region surrounded by a dashed line in FIG. 21A corresponds to one memory cell MC.

Figure 22A:
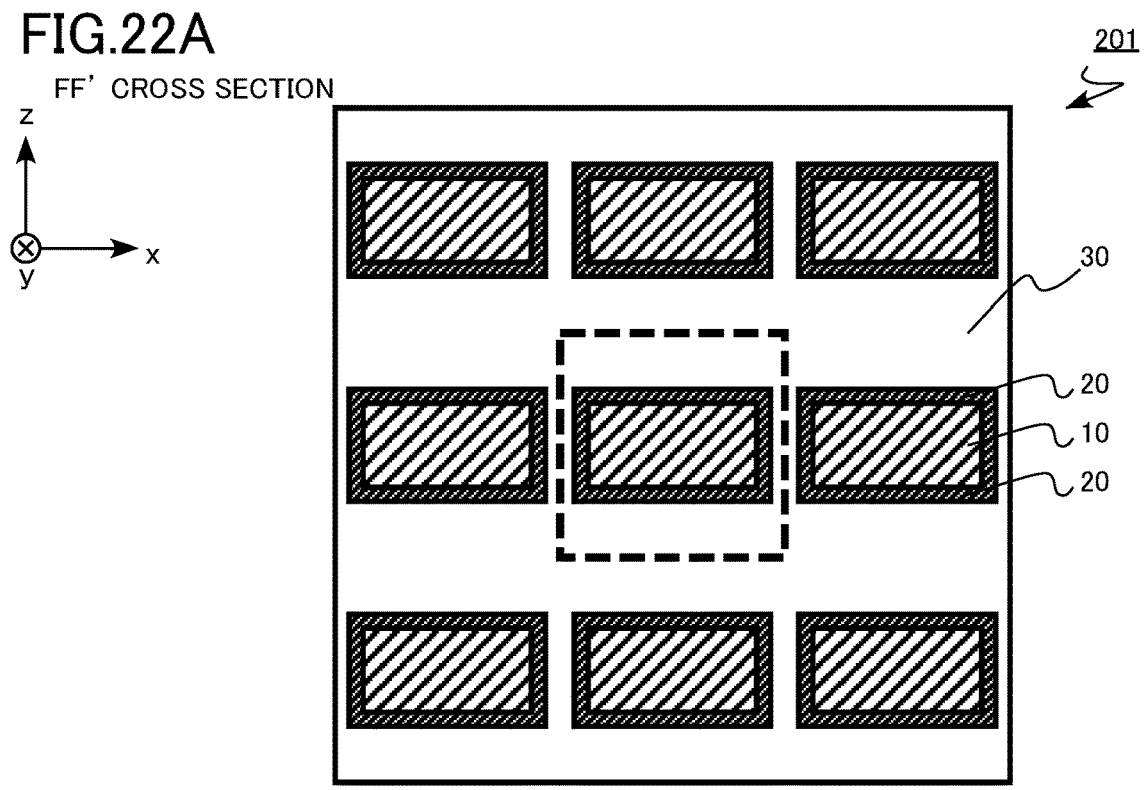
FIGS. 22A and 22B are schematic cross-sectional views of the memory cell array of the memory device of the second embodiment.
Figure 22B:
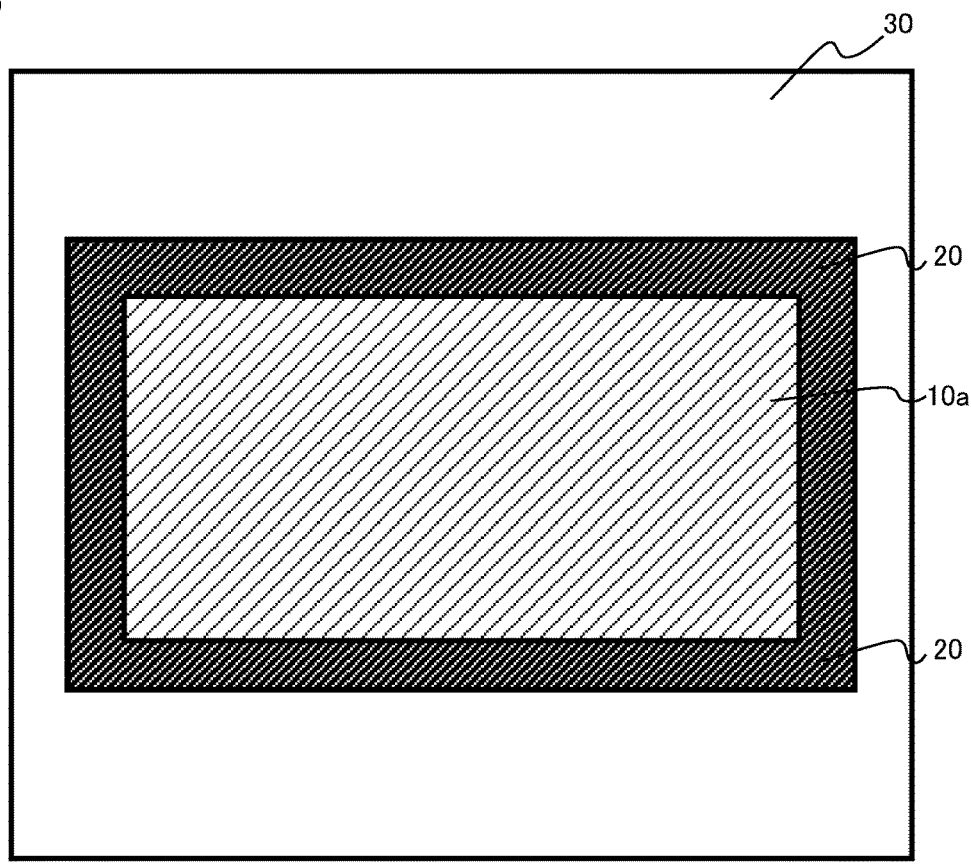

FIGS. 22A and 22B are schematic cross-sectional views of the memory cell array of the memory device of the second embodiment. FIG. 22A is an xz cross-sectional view of the memory cell array 201. FIG. 22A illustrates an FF' cross section of FIG. 20A. FIG. 22B is an enlarged view of a part of FIG. 22A. A region surrounded by a dashed line in FIG. 22A corresponds to one memory cell MC.

The memory cell array 201 of the second embodiment includes a word line WL (first conductive layer), a local bit line LBL (second conductive layer), a resistive change layer 10 (resistive change element), a parallel resistance region 20 (first region), an interlayer insulating layer 30, and a selector region 40 (second region). The resistive change layer 10 includes the first metal oxide layer 10a (first layer) and the second metal oxide layer 10b (second layer).

The selector region 40 (second region) is provided between the word line WL and the resistive change layer 10. The selector region 40 (second region) is provided between the word line WL and the first metal oxide layer 10a. The selector region 40 (second region) is in contact with the parallel resistance region 20.

The selector region 40 functions as a switching element. The selector region 40 has nonlinear current-voltage characteristics in which current sharply rises at a specific voltage (threshold voltage). The selector region 40 has a function of suppressing an increase in half-selected leak current flowing in a half-selected memory cell MC.

The selector region 40 is formed of, for example, the same material as the parallel resistance region 20. The selector region 40 contains the first metal oxide. The selector region 40 contains the first metal oxide as a main component. Containing the first metal oxide as a main component means that the first metal oxide has the highest molar ratio among substances constituting the selector region 40. The first metal oxide has a molar ratio of, for example, equal to or more than 80%.

The first metal oxide corresponds to at least one selected from the group consisting of, for example, tantalum oxide, lanthanum oxide, and hafnium oxide.

The selector region 40 has a width (d6 in FIG. 20B) in the y direction, for example, substantially the same as a width (d7 in FIG. 20B) of the parallel resistance region 20 in the z direction. In addition, the selector region 40 has the width d6 in the y direction, the width d6 being, for example, smaller than the width d7 of the parallel resistance region 20 in the z direction.

The selector region 40 has the width d6 in the y direction, the width d6 being, for example, equal to or more than 0.5 nm and equal to or less than 5 nm.

As illustrated in FIGS. 22A and 22B, the resistive change layer 10 is surrounded by the parallel resistance region 20 in a plane perpendicular to the direction from the word line WL to the local bit line LBL, that is, the plane (xz plane) perpendicular to the y direction.

When a predetermined read voltage (Vread) is applied between the word line WL and the local bit line LBL, the parallel resistance region 20 has a resistance (R parallel) lower than a combined resistance of a resistance (R cell off) of the resistive change layer 10 in the high resistance state and a resistance (R selector) of the selector region 40, and has a resistance (R parallel) higher than a combined resistance of a resistance (R cell on) of the resistive change layer 10 in the low resistance state and a resistance (R selector) of the selector region 40.

The memory cell array 201 of the second embodiment can be manufactured by omitting the process of etching the first metal oxide film 60 illustrated in FIGS. 16A and 16B in the method of manufacturing the memory cell array 101 of the first embodiment. The first metal oxide film 60 remaining without being etched finally turns to the selector region 40.

Functions and effects of the memory device of the second embodiment will now be described.

Figure 23:
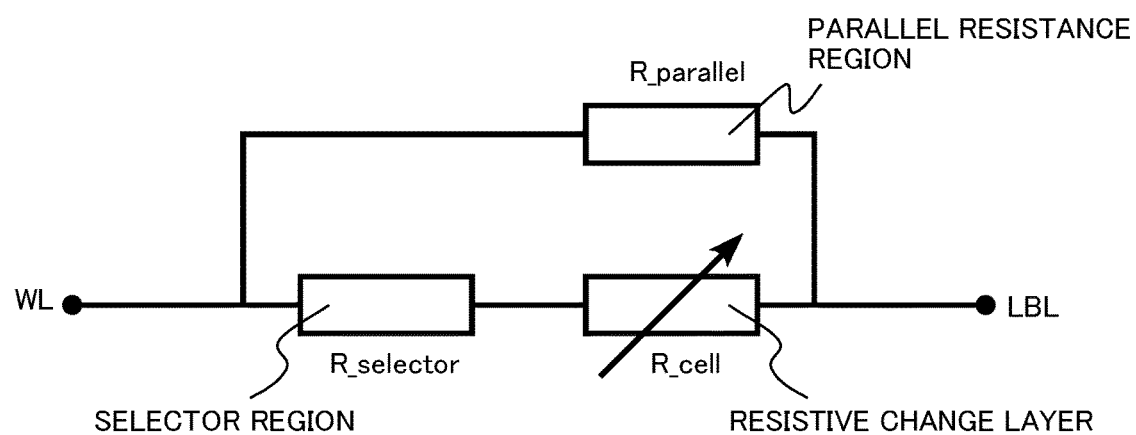
FIG. 23 is an explanatory diagram of functions and effects of the second embodiment.

FIG. 23 is an explanatory diagram of the functions and effects of the second embodiment. FIG. 23 is an equivalent circuit diagram of the memory cell MC of the second embodiment.

In addition to the resistive change layer 10, the resistive random access memory of the second embodiment includes the parallel resistance region 20 between the word line WL and the local bit line LBL. The parallel resistance region 20 is in contact with the word line WL and the local bit line LBL. The selector region 40 is further provided between the word line WL and the resistive change layer 10.

As illustrated in FIG. 23, the resistance of the selector region 40 and that of the resistive change layer 10 are connected in series between the word line WL and the local bit line LBL. As illustrated in FIG. 23, the resistance of the parallel resistance region 20 and those of the selector region 40 and the resistive change layer 10 are connected in parallel between the word line WL and the local bit line LBL.

When a predetermined read voltage (Vread) is applied between the word line WL and the local bit line LBL, the parallel resistance region 20 has a resistance (R parallel) lower than a combined resistance of a resistance (R cell off) of the resistive change layer 10 in the high resistance state and a resistance (R selector) of the selector region 40, and has a resistance (R parallel) higher than a combined resistance of a resistance (R cell on) of the resistive change layer 10 in the low resistance state and a resistance (R selector) of the selector region 40.

As a result, the level of the off-current (Ioff) is determined by the resistance of the parallel resistance region 20 lower than that of the resistive change layer 10 in the high resistance state in the memory cell MC of the resistive random access memory 100. In other words, the off-current (Ioff) increases compared to the off-current (Icell off in FIG. 19B) in the case where the parallel resistance region 20 is not provided.

It should be noted that the selector region 40 has high nonlinearity of current-voltage characteristics and, when a predetermined read voltage (Vread) is applied, the selector region 40 has resistance (R selector) sufficiently lower than the resistance (R cell) of the resistive change layer 10. As a result, there hold a relation in which, when a predetermined read voltage (Vread) is applied between the word line WL and the local bit line LBL, the parallel resistance region 20 has a resistance (R parallel) lower than a combined resistance of a resistance (R cell off) of the resistive change layer 10 in the high resistance state and a resistance (R selector) of the selector region 40, and has a resistance (R parallel) higher than a combined resistance of a resistance (R cell on) of the resistive change layer 10 in the low resistance state and a resistance (R selector) of the selector region 40.

As in the first embodiment, the resistive random access memory of the second embodiment can thus guarantee the off-state of the memory cell MC and inhibit variation of current flowing in the memory cell MC by providing the parallel resistance region 20. A resistive random access memory capable of improving reliability can thus be achieved.

In addition, in the resistive random access memory of the second embodiment, when a voltage (½ Vset) of half a predetermined write voltage (set voltage (Vset)) is applied between the word line WL and the local bit line LBL, the selector region 40 has a resistance higher than that of the resistive change layer 10. In addition, when a voltage (Vread/2) of half a predetermined read voltage (Vread)) is applied between the word line WL and the local bit line LBL, the selector region 40 has a resistance higher than that of the resistive change layer 10. In addition, when a voltage (Vreset/2) of half a predetermined reset voltage (Vreset) is applied between the word line WL and the local bit line LBL, the selector region 40 has a resistance higher than that of the resistive change layer 10.

An increase in the half-selected leak current flowing in the half-selected memory cell MC can thus be suppressed. A memory device with low power consumption and stable operation can thus be achieved.

In terms of optimization of the current-voltage characteristics of the selector region 40, the selector region 40 preferably has the width d6 in the y direction, the width d6 being smaller than the width d7 of the parallel resistance region 20 in the z direction.

In terms of suppressing the half-selected leak current in the half-selected memory cell MC, when a voltage (Vset/2) of half a predetermined write voltage (set voltage (Vset)) is applied between the word line WL and the local bit line LBL, the parallel resistance region 20 preferably has a resistance higher than a combined resistance of the resistance of the resistive change layer 10 in the high resistance state and that of the selector region 40. In terms of achieving the above-described characteristics, the parallel resistance region 20 preferably has current-voltage characteristics of high nonlinearity.

In terms of suppressing the half-selected leak current in the half-selected memory cell MC, when a voltage (Vread/2) of half a predetermined read voltage (Vread) is applied between the word line WL and the local bit line LBL, the parallel resistance region 20 preferably has a resistance higher than a combined resistance of the resistance of the resistive change layer 10 in the high resistance state and that of the selector region 40. In terms of achieving the above-described characteristics, high nonlinearity is preferred.

In terms of suppressing the half-selected leak current in the half-selected memory cell MC, when a voltage (Vreset/2) of half a predetermined reset voltage (Vreset) is applied between the word line WL and the local bit line LBL, the parallel resistance region 20 preferably has a resistance higher than a combined resistance of the resistance of the resistive change layer 10 in the high resistance state and that of the selector region 40. In terms of achieving the above-described characteristics, high nonlinearity is preferred.

As described above, according to the second embodiment, as in the first embodiment, a resistive random access memory capable of improving reliability can be achieved by providing the parallel resistance region. In addition, a memory device with low power consumption and stable operation can be achieved by providing the selector region 40.

Although, in the first and second embodiments, an example in which the local bit line LBL extends in the direction perpendicular to the surface of the semiconductor substrate has been described, there can be provided a memory-cell-array structure in which, for example, the word line WL and the local bit line LBL extend in a direction parallel to the surface of the semiconductor substrate.

Although, in the first and second embodiments, an example of two-layer structure in which the resistive change layer 10 includes the first metal oxide layer 10a (first layer) and the second metal oxide layer 10b (second layer) has been described, the resistive change layer 10 can have a single-layer structure or structure of equal to or more than three layers.

Although, in the first and second embodiments, an example of the filament-type resistive random access memory with a resistive change element including metal oxide has been described, the disclosure can be applied to other two-terminal resistive random access memories.

While certain embodiments have been described, these embodiments have been presented by way of example only, and are not intended to limit the scope of the inventions. Indeed, the memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A memory device comprising:
    a first conductive layer;
    a second conductive layer;
    a first region provided between the first conductive layer and the second conductive layer, the first region being in contact with the first conductive layer and the second conductive layer, the first region including a first metal oxide, and the first metal oxide being at least one metal oxide selected from a group consisting of tantalum oxide, lanthanum oxide, and hafnium oxide;
    a first layer provided between the first conductive layer and the second conductive layer, the first layer including a second metal oxide different from the first metal oxide; and
    a second region provided at least one of a position between the first conductive layer and the first layer and a position between the second conductive layer and the first layer, the second region including the first metal oxide, and the second region being in contact with the first region.

2. The memory device according to claim 1, wherein the first region has a cross-sectional area in a plane perpendicular to a direction from the first conductive layer to the second conductive layer, the cross-sectional area being equal to or more than 0.33 times and equal to or less than one time of a cross-sectional area of the first layer in the plane.

3. The memory device according to claim 1, further comprising a second layer provided at one of a position between the first conductive layer and the first layer and a position between the second conductive layer and the first layer and including a third metal oxide different from both of the first metal oxide and the second metal oxide.

4. The memory device according to claim 3, wherein the first layer and the second layer are in contact with each other.

5. The memory device according to claim 1, wherein the second metal oxide is at least one metal oxide selected from a group consisting of titanium oxide, aluminum oxide, tantalum oxide, and hafnium oxide.

6. The memory device comprising:
a first conductive layer extending in a first direction;
a second conductive layer extending in a second direction intersecting the first direction;
a first region provided between the first conductive layer and the second conductive layer, the first region being in contact with the first conductive layer and the second conductive layer, and the first region including a first metal oxide;
a resistive change element provided between the first conductive layer and the second conductive layer; and
a second region provided at one of a position between the first conductive layer and the resistive change element and a position between the second conductive layer and the resistive change element, the second region including the first metal oxide, and the second region being in contact with the first region.

7. The memory device according to claim 6, wherein the first region has a width in the first direction, the width being greater than a width of the second conductive layer in the first direction.

8. The memory device according to claim 6, wherein the first region has a cross-sectional area in a plane perpendicular to a direction from the first conductive layer to the second conductive layer, the cross-sectional area being equal to or more than 0.33 times and equal to or less than one time of a cross-sectional area of the resistive change element in the plane.

9. The memory device according to claim 6, wherein the first metal oxide is at least one metal oxide selected from a group consisting of tantalum oxide, lanthanum oxide, and hafnium oxide.

10. The memory device according to claim 6, wherein the resistive change element includes a first layer including a second metal oxide different from the first metal oxide.

11. The memory device according to claim 10, wherein the second metal oxide is at least one metal oxide selected from a group consisting of titanium oxide, aluminum oxide, tantalum oxide, and hafnium oxide.

12. The memory device according to claim 10, wherein the resistive change element includes a second layer provided at one of a position between the first conductive layer and the first layer and a position between the second conductive layer and the first layer, and the resistive change element including a third metal oxide different from both of the first metal oxide and the second metal oxide.

13. A memory device comprising:
a first conductive layer;
a second conductive layer;
a first region provided between the first conductive layer and the second conductive layer, the first region being in contact with the first conductive layer and the second conductive layer; and
a resistive change element provided between the first conductive layer and the second conductive layer, the resistive change element being changed from a high resistance state to a low resistance state by applying a predetermined write voltage between the first conductive layer and the second conductive layer,
wherein, when a predetermined read voltage is applied between the first conductive layer and the second conductive layer, the first region has a resistance lower than a resistance of the resistive change element in the high resistance state, and the first region has a resistance higher than a resistance of the resistive change element in the low resistance state.

14. The memory device according to claim 13,
wherein, when a voltage of half the predetermined write voltage is applied between the first conductive layer and the second conductive layer, the first region has a resistance higher than a resistance of the resistive change element in the high resistance state, and
when a voltage of half the predetermined read voltage is applied between the first conductive layer and the second conductive layer, the first region has a resistance higher than a resistance of the resistive change element in the high resistance state.

* * * * *